United States Patent [19]

Geldman et al.

[11] Patent Number: 4,979,173
[45] Date of Patent: Dec. 18, 1990

[54] BURST MODE ERROR DETECTION AND DEFINITION

[75] Inventors: John S. Geldman, Los Gatos; Petro Estakhri, Fremont, both of Calif.

[73] Assignee: Cirrus Logic, Inc., Milpitas, Calif.

[21] Appl. No.: 99,353

[22] Filed: Sep. 21, 1987

[51] Int. Cl.$^5$ ...................... G06F 11/10; H03K 23/40
[52] U.S. Cl. .................... 371/39.1; 371/37.1; 371/40.1; 377/116
[58] Field of Search ...................... 371/40, 37, 38, 39, 371/39.1, 37.1, 37.6, 38.1, 40.1; 377/116

[56] References Cited

U.S. PATENT DOCUMENTS

| | | | |
|---|---|---|---|
| 3,478,313 | 11/1969 | Srinivasan | 371/39.1 |
| 3,508,197 | 4/1970 | Tong | 371/45 |
| 3,582,881 | 6/1971 | Burton | 371/39.1 |
| 3,629,824 | 12/1971 | Bossen | 371/37.4 |
| 3,648,236 | 3/1972 | Burton | 371/37.1 |
| 3,648,239 | 3/1972 | Carter et al. | 371/37.7 |
| 3,697,949 | 10/1972 | Carter et al. | 371/40.1 |
| 3,714,629 | 1/1973 | Hong et al. | 371/37.8 |
| 3,725,859 | 4/1973 | Blair et al. | 371/39.1 |
| 3,742,449 | 6/1973 | Blair | 371/38.1 |
| 3,755,779 | 8/1973 | Price | 371/40.1 |
| 3,775,746 | 11/1973 | Boudreau et al. | 371/38.1 |
| 3,781,791 | 12/1973 | Sullivan | 371/37.1 |
| 3,811,108 | 5/1974 | Howell | 371/37.1 |
| 3,831,143 | 8/1974 | Trafton | 371/37.4 |
| 4,030,067 | 6/1977 | Howell et al. | 371/37.7 |
| 4,032,886 | 6/1977 | En et al. | 371/45 |
| 4,108,359 | 8/1978 | Proto | 371/53 X |
| 4,156,867 | 5/1979 | Bench et al. | 371/37.7 |
| 4,216,540 | 8/1980 | McSpadden | 371/37.1 |
| 4,241,446 | 12/1980 | Trubinsky | 371/37.1 |
| 4,276,647 | 6/1981 | Thacker et al. | 371/39.1 |
| 4,291,406 | 9/1981 | Bahl et al. | 371/44 |
| 4,584,686 | 4/1986 | Fritze | 371/37.1 |

OTHER PUBLICATIONS

Malvino, A. et al., *Digital Principles and Applications*, McGraw-Hill, 1981, pp. 58–62.
Glover, N., *Practical Error Correction Design for Engineers*, Data Systems Technology, 1982, pp. 18–92.
Lin, S. et al., *Error Control Coding*, Prentice-Hall, 1983, pp. 58–68, 125, 126, 259–261.
Western Digitasl WD5011-10 Winchester Disk Controller, data sheet, 1986.
Adaptec AIC-010-15, AIC-010-10 & AIC-010 Programmable Storage Controller, preliminary data sheet.
Adaptec AIC-010F-10, AIC-010F-15, AIC-010F-24 Programmable Storage Controller, preliminary data sheet, 8/86.
Cirrus Logic CL-SH130 Winchester Hard Disk Formatter, preliminary data sheet, 7/87.
Cirrus Logic Cl-SH 135 Enhanced Winchester Hard Disk Formatter, preliminary data sheet, 9/87.
Cirrus Logic Cl-SH250 Integrated SCSI Disk Controller, advance data sheet, 10/87.
Cirrus Logic CL-SH260 Integrated PC XT/AT Disk Controller, preliminary data sheet, 5/88.

*Primary Examiner*—Jerry Smith
*Assistant Examiner*—Stephen M. Baker
*Attorney, Agent, or Firm*—Skjerven, Morrill, MacPherson, Franklin & Friel

[57] ABSTRACT

A network for detection and correction of errors in a digital signal data stream, using an encoded code remainder that augments the data stream. The network utilizes a linear shift feedback register and a data register that works as a shifter or as a counter in assisting the error detection/correction process. Although the digital signal is in the form of serial data, the data register works with bytes, rather than bits, in a parallel arrangement so that the processing time is substantially reduced.

11 Claims, 30 Drawing Sheets

FIGURE 4a

| FIG. 1a | FIG. 1b | FIG. 1d | FIG. 1f | FIG. 1h |
|---------|---------|---------|---------|---------|
|         | FIG. 1c | FIG. 1e | FIG. 1g | FIG. 1i |

FIGURE 1

| FIG. 4a | FIG. 4b | FIG. 4c |
|---------|---------|---------|

FIGURE 4

NOTE:
A = NUMBER OF ADDRESS MARK BYTES
K = NUMBER OF BYTES IN DATA FIELD

DF2R

A: LOAD* = 1 (TRANSMIT)
   LOAD* = 0 (HOLD)

B: LOAD* = 0 (TRANSMIT)
   LOAD* = 1 (HOLD)

C: φ1 = 0 (HOLD)
   φ1 = 1 (TRANSMIT)

D: φ1 = 0 (TRANSMIT)
   φ1 = 1 (HOLD)

E: φ1 = 0 (TRANSMIT)
   φ1 = 1 (HOLD)

F: φ1 = 0 (HOLD)
   φ1 = 1 (TRANSMIT)

$q(t) = d2\ (t - \Delta t_{CLK})$ if LOAD* = 1
$\phantom{q(t)} = d1\ (t - \Delta t_{CLK})$ if LOAD* = 0

FIG. 5

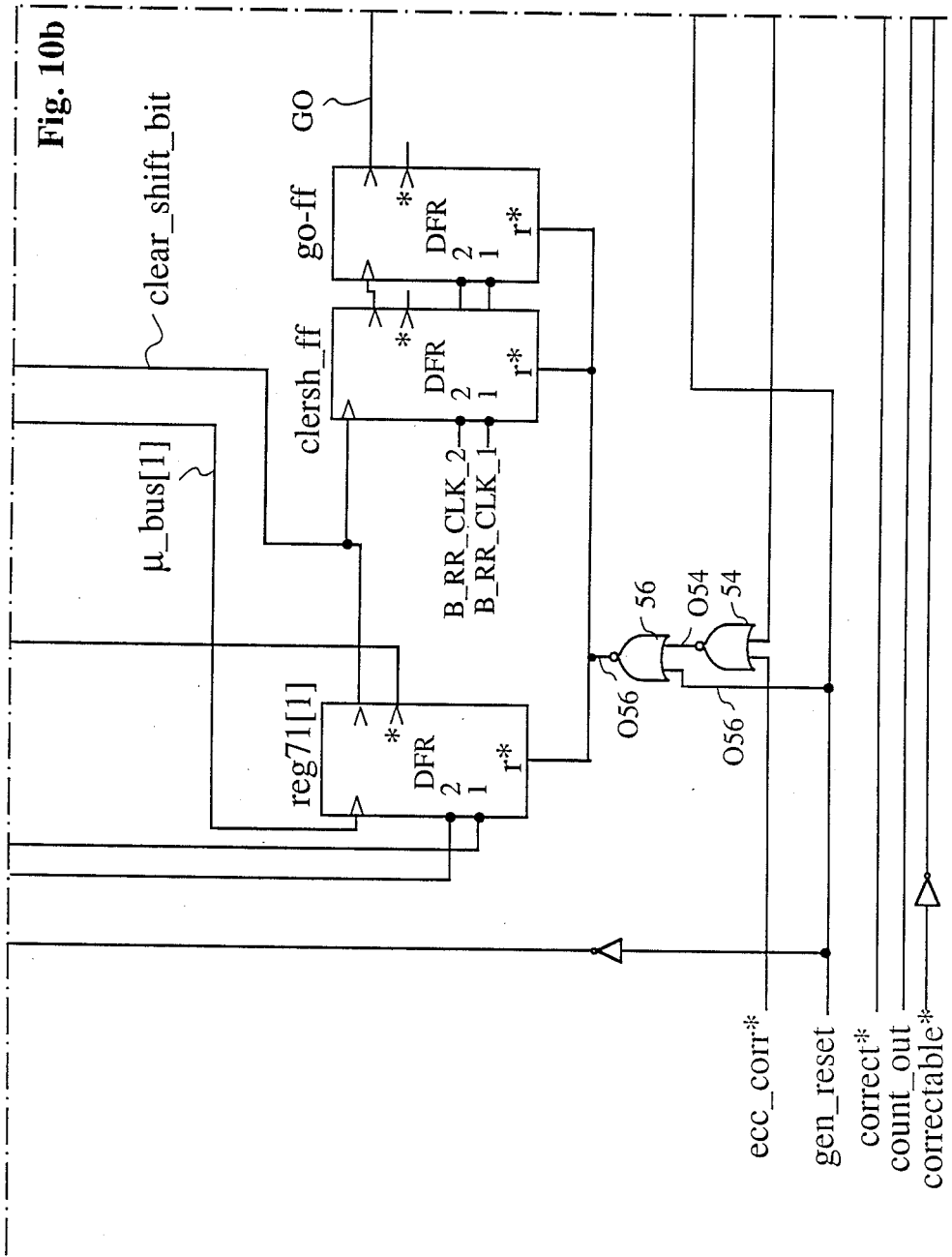

BURST MODE ERROR DETECTION AND DEFINITION

FIELD OF THE INVENTION

This invention relates to detection and correction of burst errors that may arise in the transmission and receipt of digital computer data.

BACKGROUND OF THE INVENTION

A digital computer operates on words of a predetermined length, each word having an ordered sequence of, say, k bits. When a word, or a series of words, is transmitted and received, some opportunity for error exists, whereby one or more of the resulting bits is in error. One general method of detecting single bit errors is the parity check. The k bits of each word are written in a square matrix or table M, augmented by an appropriate sequence of zeroes if the word length is not some power of the integer two (2), the number of ones (1) in each row (and each column) of the original message is counted, and an even or odd parity symbol is associated with each row (or column) according as the number of ones in that row (or column) is even or odd. The word, or series of words, augmented by the parity check information is then transmitted, and the row/column parity associated with each word or series is again determined. If a single discrepancy in parity occurs in each of one row and one column, an error in transmission/receipt has probably occurred at the bit determined by the confluence of that row and that column. This parity check approach is discussed in *Digital Principles and Applications* by A. P. Malvino and D. P. Leach, McGraw-Hill Book Co., Third Edition, 1981, pp. 58–62.

Where precisely two errors occur in transmission/receipt of a word, if the two errors occur in two bits in the same row or same column of the matrix M the two errors in that row or column will effectively cancel; and the parity symbol associated with that row or column will provide no information on existence or locations of an error. The troubles are compounded when more than two errors occur in the same word or series of words. One might, for example, encounter a "burst" error, where each of a consecutive sequence of bits is in error. The invention described herein facilitates detection and correction of burst mode errors up to a predetermined burst length.

SUMMARY OF THE INVENTION

One object of this invention is to provide apparatus for digital signal error detection and correction in a computer having a data register, wherein the data register also operates as a counter.

Another object of this invention is to provide apparatus for digital signal error detection and correction that can operate at very high bit processing rates.

Another object of this invention is to provide apparatus for digital signal error correction is a computer that performs serial processing by shifting of a plurality of consecutive bits (such as a byte) rather by shifting of individual bits.

Other objects of this invention, and advantages thereof, will becomes clear by reference to the detailed description and accompanying drawings.

The objects of this invention may be realized in one embodiment in a network for detecting and correcting digital signal errors of burst lengths up to a predetermined burst length number in a word of length up to a predetermined number, the network including an M-bit linear shift register, for coding and decoding of signal words, for checking for errors in the single word and determination of whether an error is correctable, and for error correction if the error is determined to be correctable. The shift register checks for errors by division of the signal word by one of a plurality of predetermined error check polynomials. The network includes a q-bit data register, directly or indirectly connected to the linear feedback shift register and having a mode control input terminal at which it receives a mode control input signal. The data register reads data from q parallel data lines into the data register and loads this data into the linear feedback shift register, shifts data within the data register in response to receipt at the mode control input terminal of a predetermined mode control input signal, and operates as a counter, with a predetermined initial count and a predetermined final count, upon receipt at the mode control input terminal of a signal other than the predetermined mode control input signal. The integer M is divisible by q.

DESCRIPTION OF THE DRAWINGS

FIG. 1 illustrates the manner in which FIGS. 1a–1i should be arranged to disclose the complete LFSR.

FIG. 5 is a detailed schematic view of one of the DF2R data storage cells used in FIG. 4a, and 4b and 4c.

FIGS. 10a–10d, when arranged in the manner illustrated in FIG. 10, provide a detailed schematic view of register $71_H$ used as a flag bit register to control other operations in connection with the invention.

DETAILED DESCRIPTION

Figure 1A:
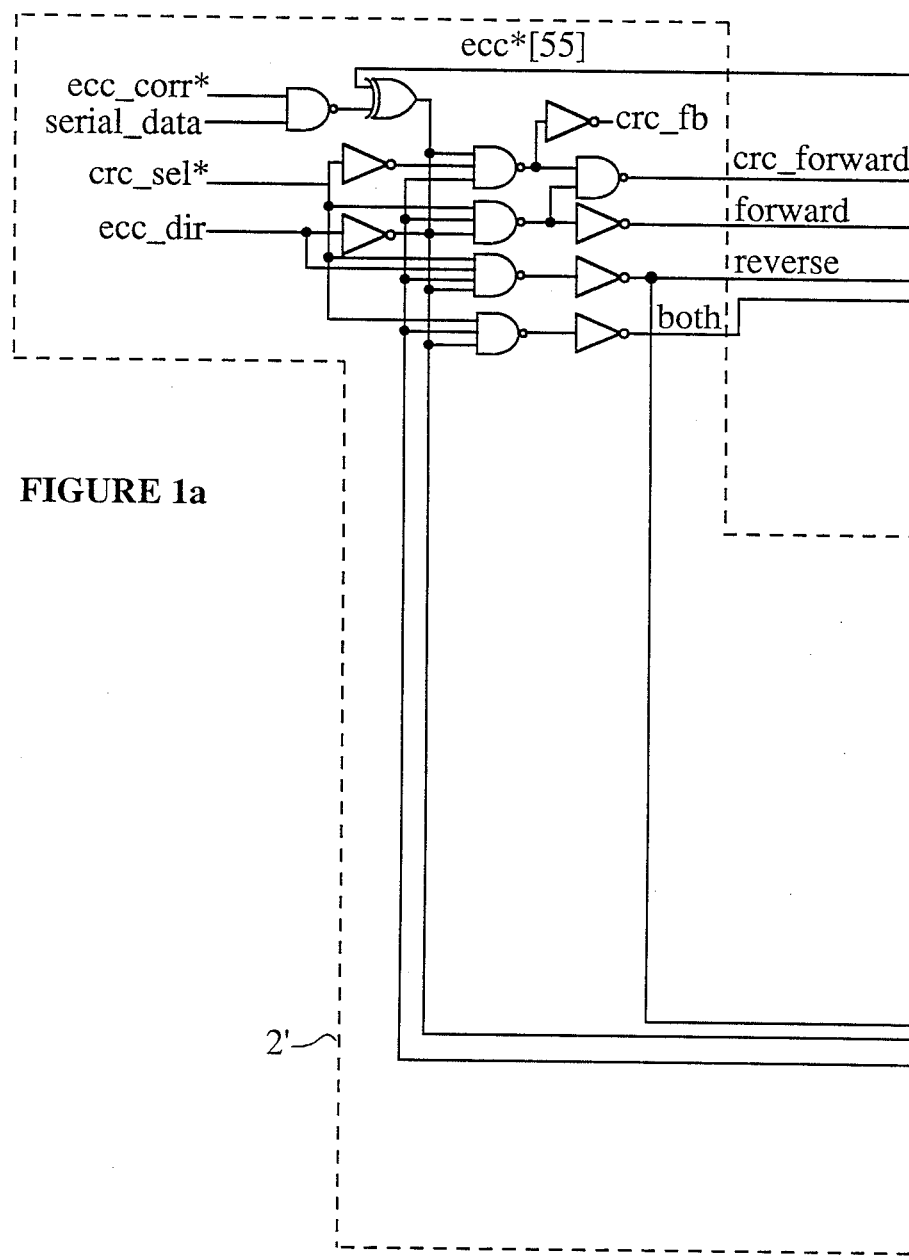
FIGS. 1a–1i when arranged in the manner illustrated in FIG. 1, present a schematic view of the linear feedback shift register (LFSR) and related circuits used in one embodiment of the invention, where the error check information in this embodiment is carried by 56 bits, the generator polynomial (one of many suitable choices) is
$P(X) = X^{52} + X^{50} + X^{43} + X^{41} + X^{34} + X^{30} + X^{26} + X^{24} + X^8 + 1$ and the number of bits in the data stream, comprising address mark plus message plus error check bits, is arbitrarily large. This generator polynomial is available under license from its developer, Neal Glover of Data Systems Technology, Broomfield, Colo. and is one of several such polynomials that may be used here.
Figure 1B:
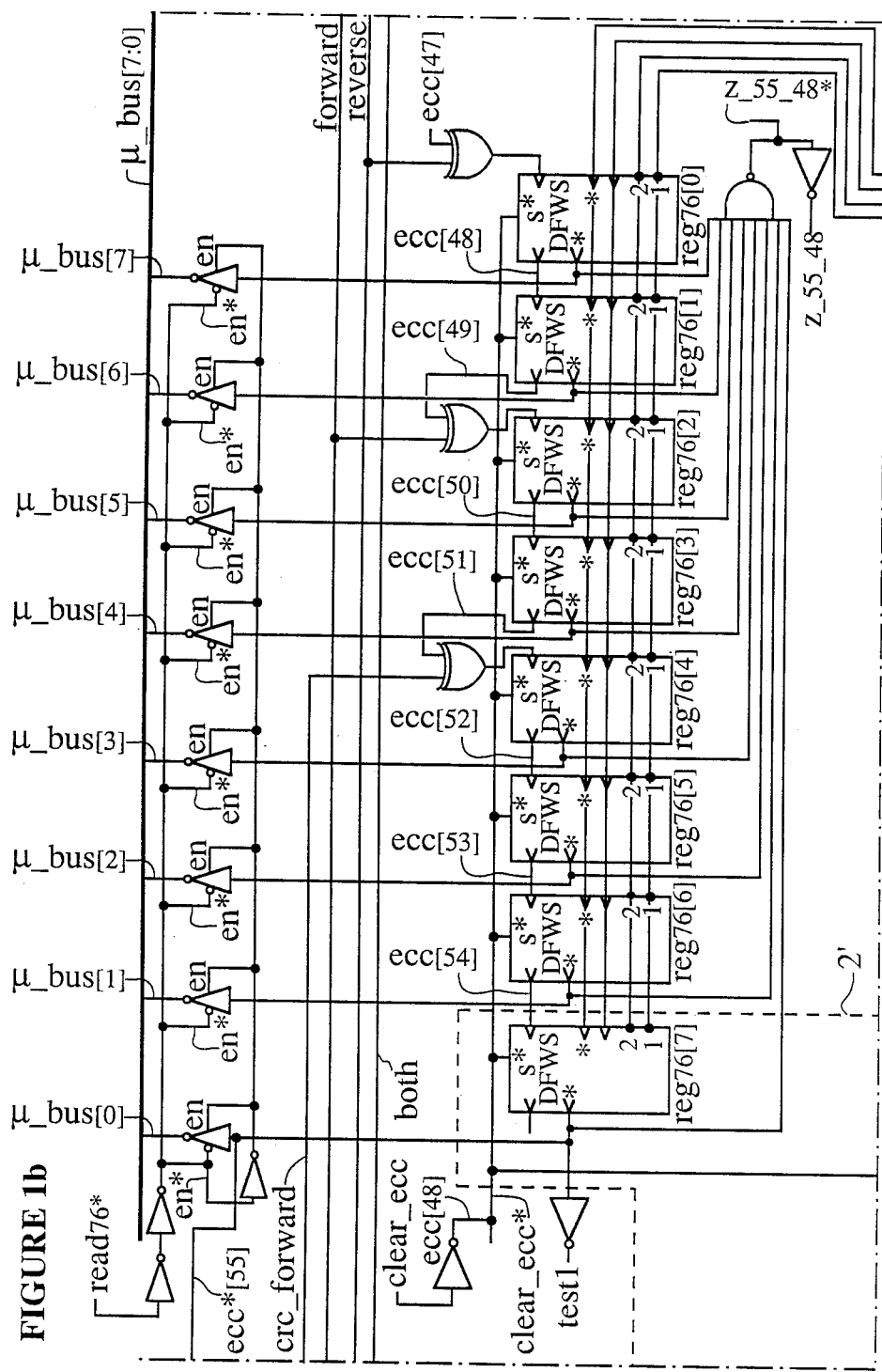
Figure 1C:
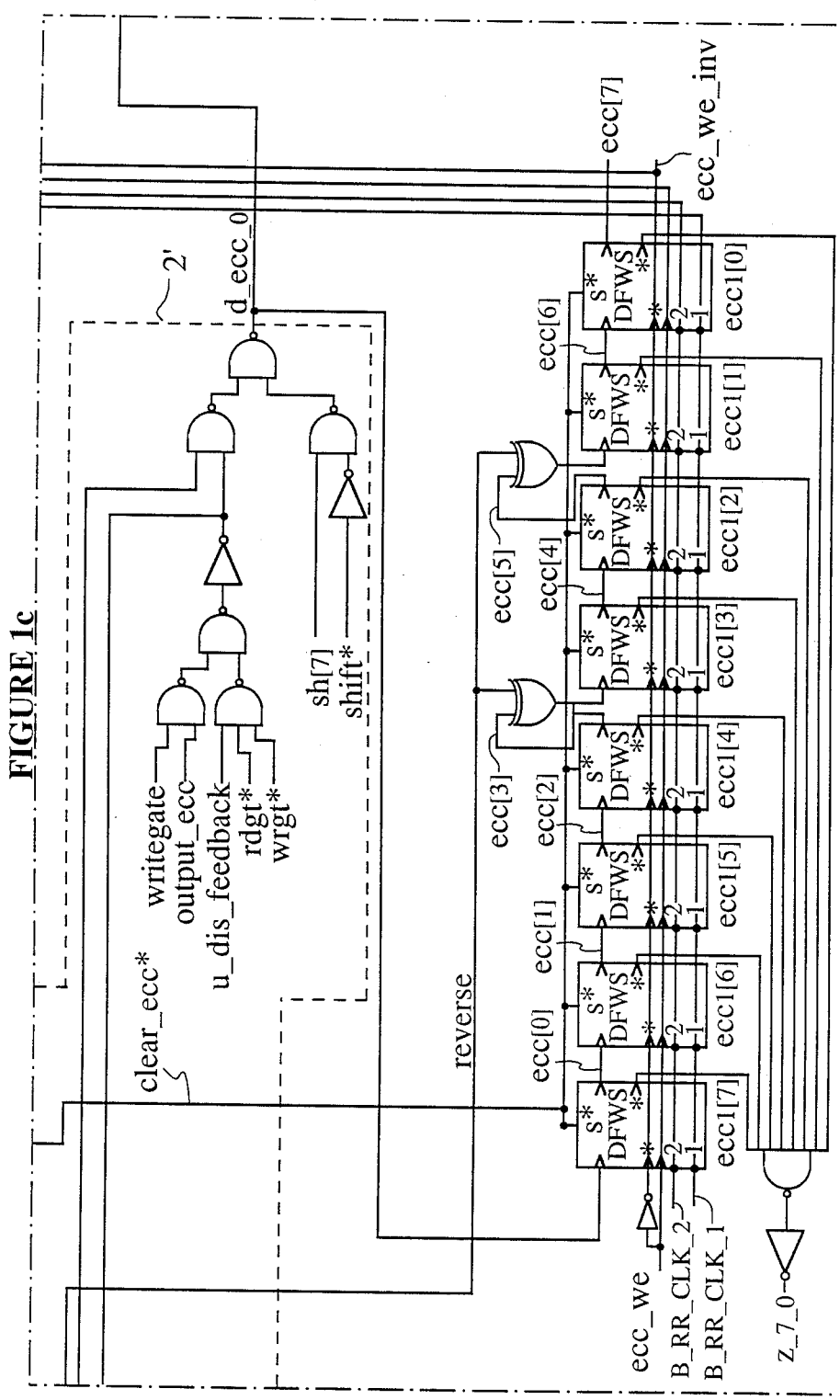
Figure 1D:
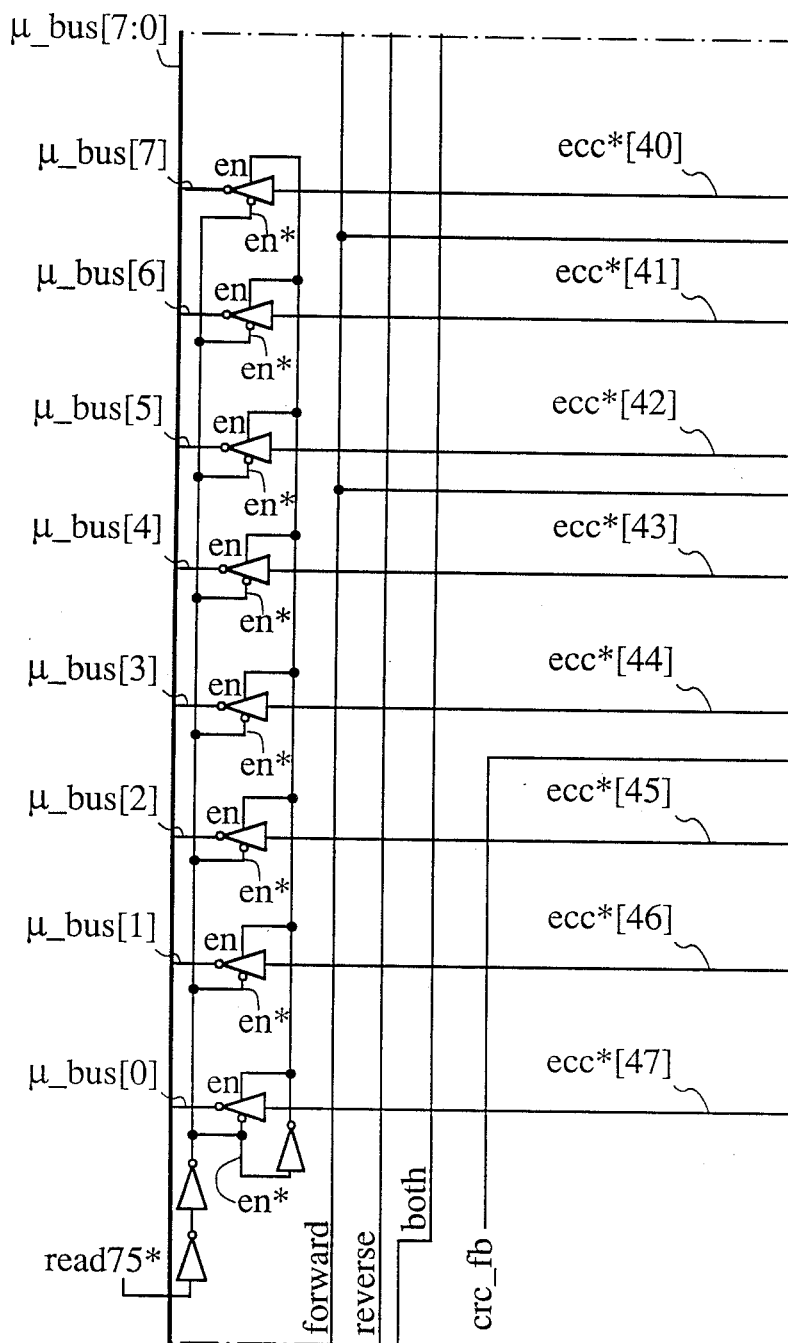
Figure 1E:
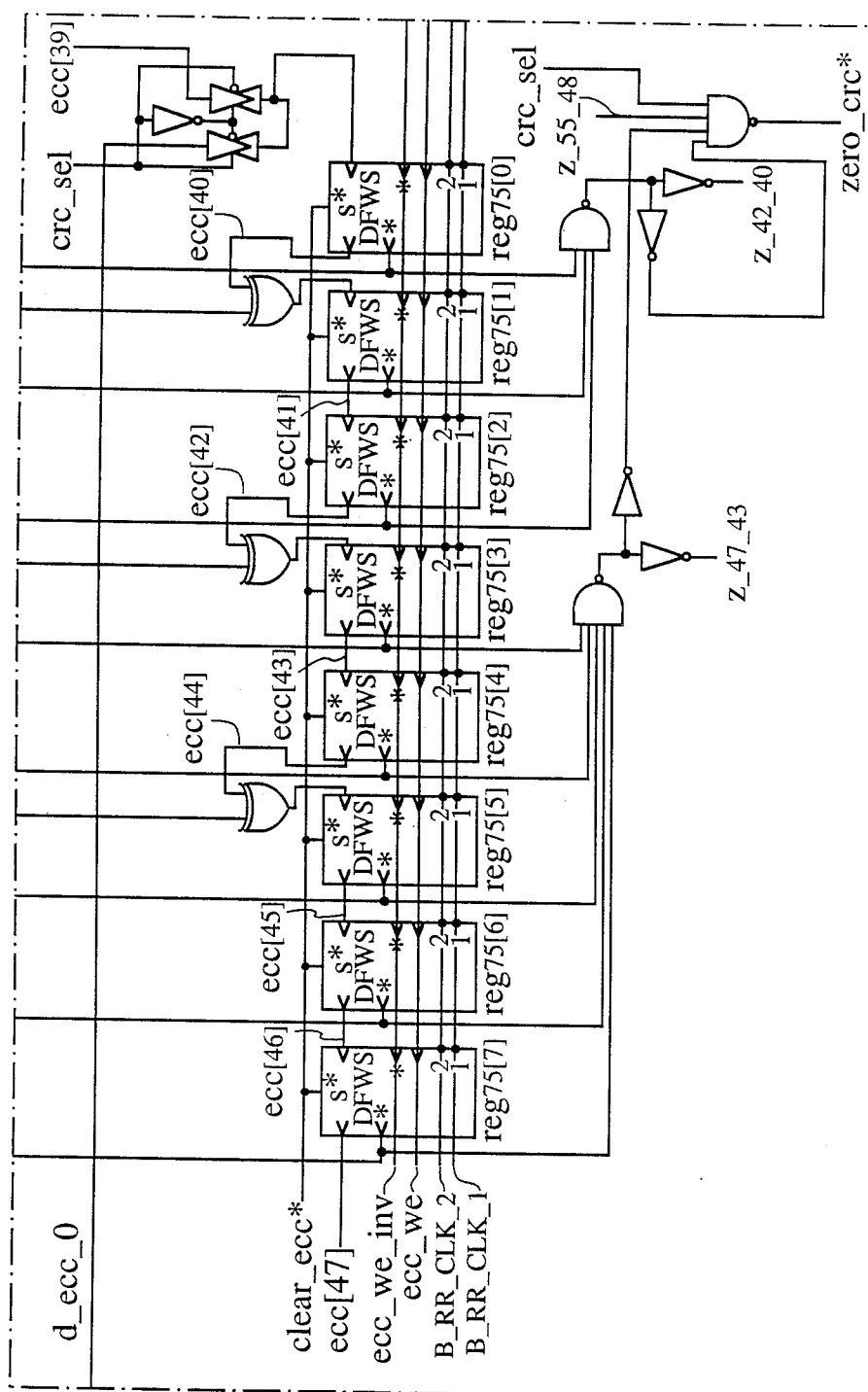
Figure 1F:
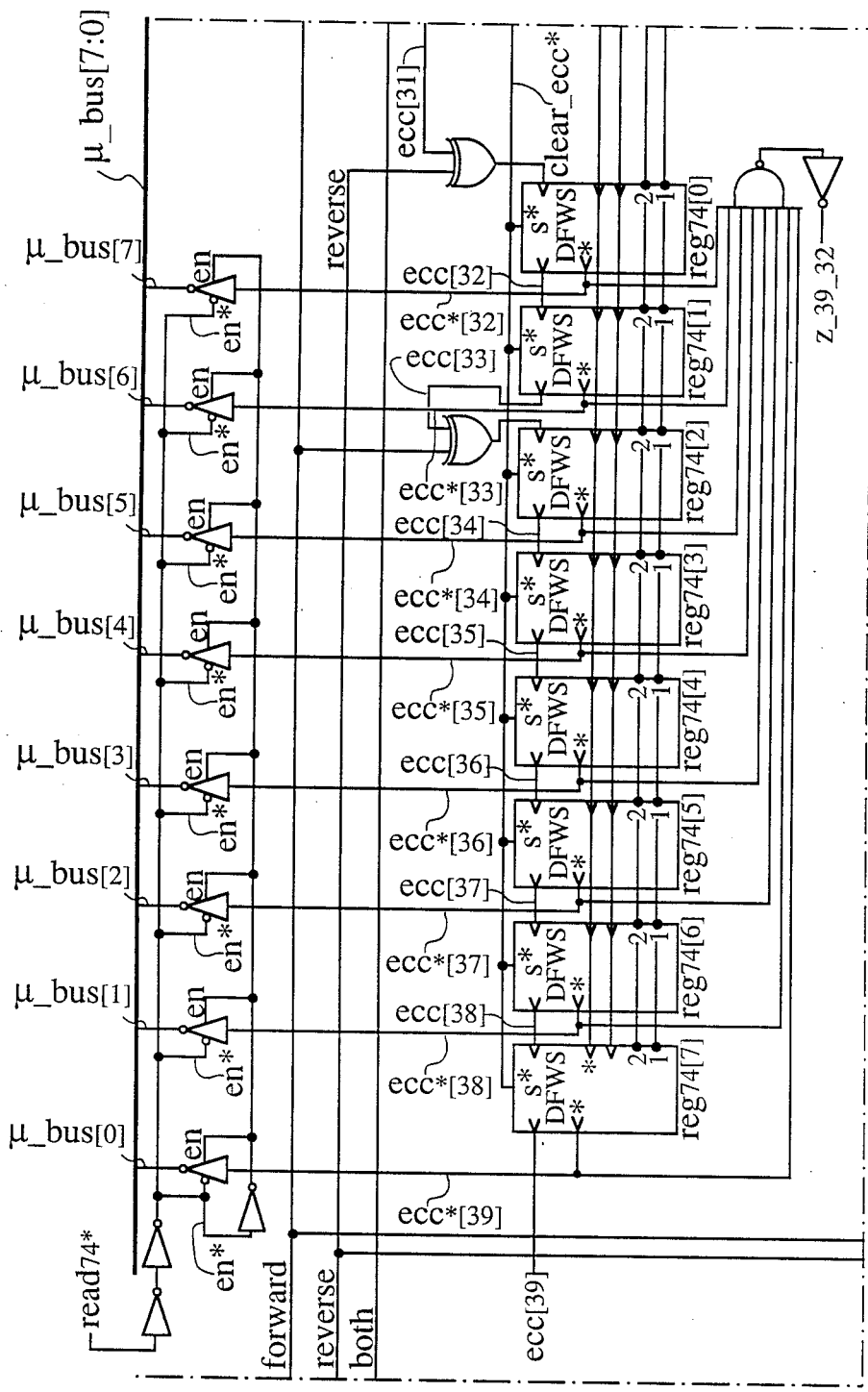
Figure 1G:
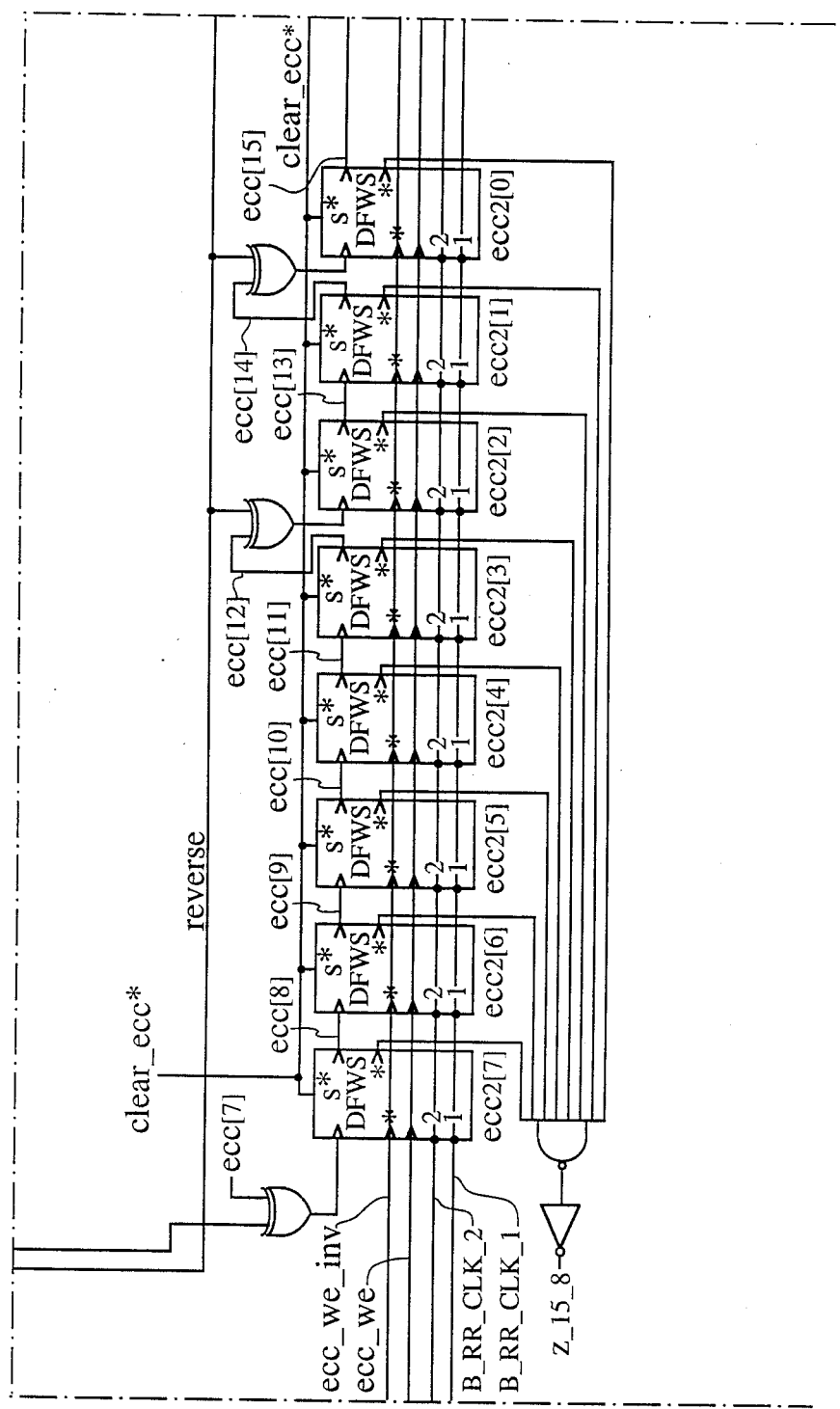
Figure 1H:
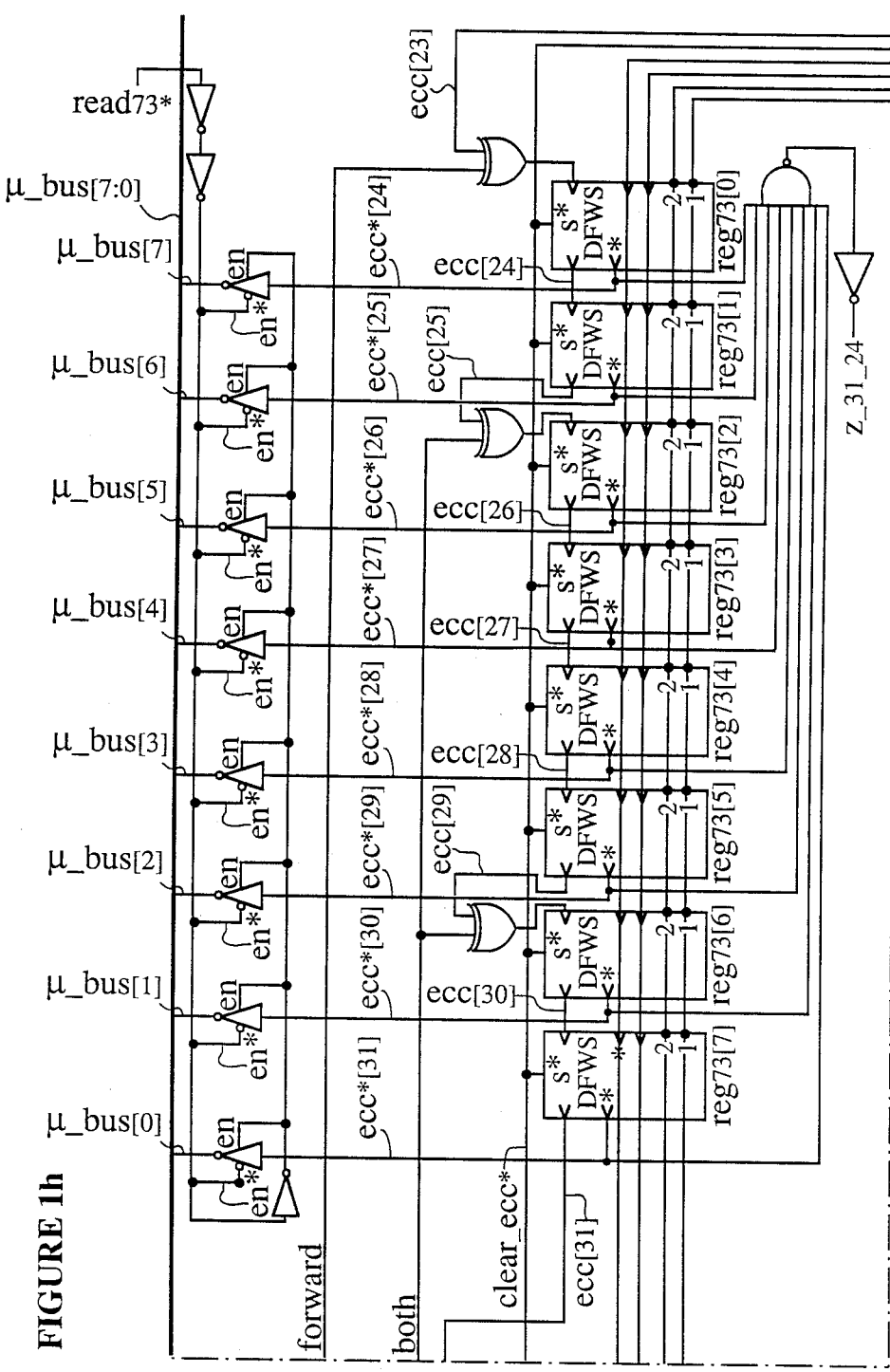
Figure 1I:
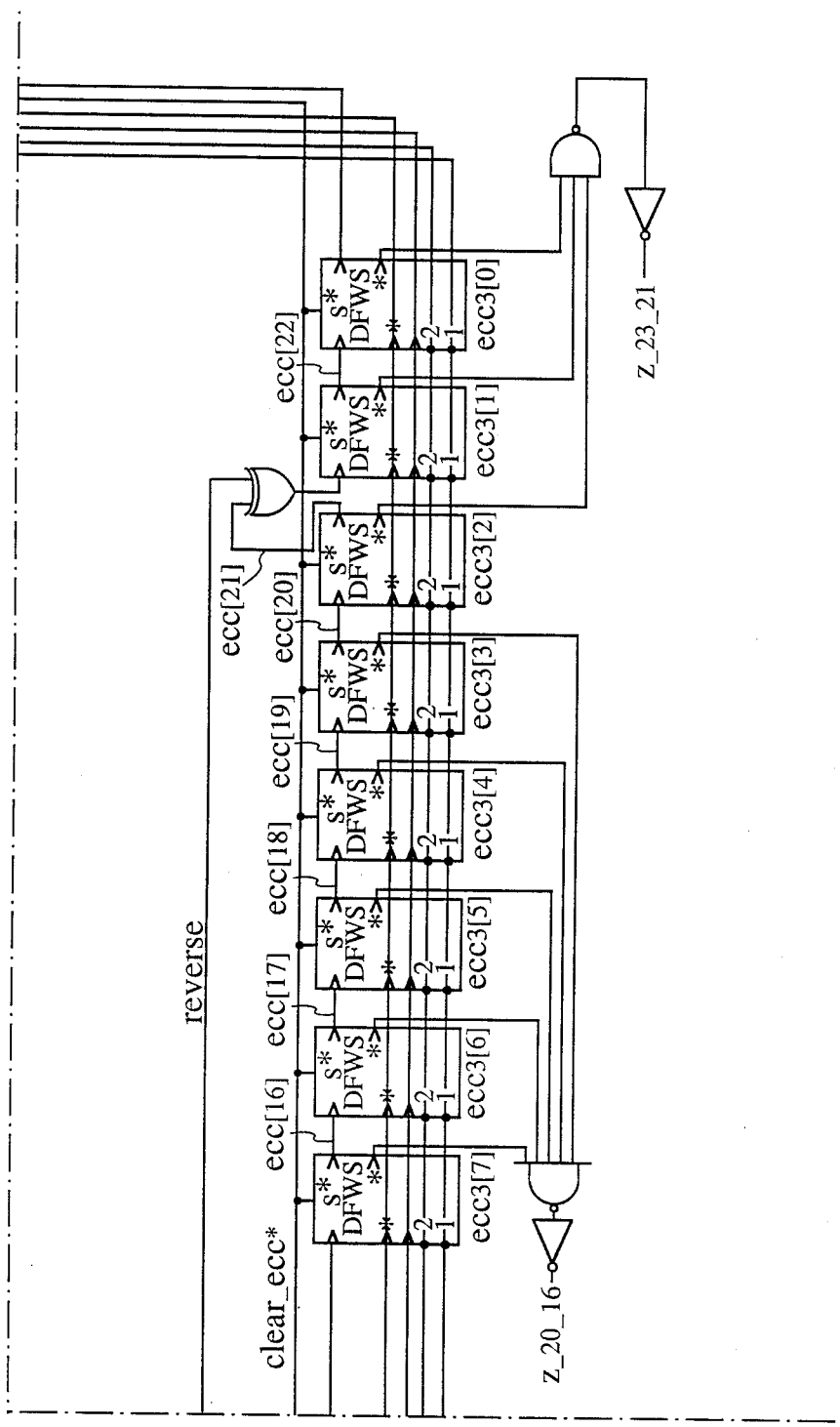

The apparatus and associated method described here is intended to detect and correct most errors in a digital message, represented as usual by a k-tuple. $u=(u_{k-1}, u_{k-2}, \ldots, u_1, u_0)$, where each element or bit $u_i$ ($0 \leq i \leq k-1$) has the value 0 or 1, $u_{k-1}$ represents the most significant bit MSB, and $u_0$ represents the least significant bit LSB of the message. In order to provide for error checks, the original message of length k bits is augmented by the addition of n—k bits of parity or other error check information to form an augmented message of length n bits. Here the length k of the message itself may be arbitrarily large, but the length n—k of the error information portion is a predetermined number, preferably a multiple of the integer 8. The invention described here is intended to work with processors that process eight consecutive bits (one byte), or more generally q consecutive bits, at a time so that the length n of the data word (message plus error check information) is also preferably a multiple of 8.

A polynomial formalism is more easily used here; a general m-tuple or vector $v=(v_{m-1}, V_{m-2}, \ldots, v_1, V_0)$, representing an m-bit word, is represented as a polynomial $$V(X) = v_{m-1}x^{m-1} + v_{m-2}x^{m-2} + \ldots v_1x + v_0,$$

where x is a dummy variable, introduced for certain bookkeeping purposes. The original message $u=(u_{k-1}, u_{k-2}, \ldots, u_1, u_0)$, with corresponding polynomial $U(x) = u_{k-1}x^{k-1} + u_{k-2}x^{k-2}30 \ldots +u_1x+u_0$, is transmitted and is received as an image $w=(w_{k-1}, w_{k-2}, \ldots, w_1, w_0)$, with corresponding polynomial $$W(x) = w_{k-1}x^{k-1} + w_{k-2}x^{k-2} + \ldots + w_1x + w_0. \tag{1}$$

Given a polynomial of degree q—1, viz.

$$P(x) = P_{q-1}x^{q-1} + P_{q-2}x^{q-2} + \ldots + P_1x + P_0, \tag{2}$$

a fundamental algorithm of algebra allows one to find a quotient polynomial $$Q(x) = q_{r-1}x^{r-1} + q_{r-2}x^{r-2} + \ldots q_1x + q_o$$

and a remainder polynomial $$R(x) = r_{s-1}x^{s-1} + r_{s-2} + \ldots r_1x + r_o$$

such that $$U(x) = P(x) \cdot Q(x) + R(x),$$

where $\text{degr}(R) = s - 1 < \text{degr}(P) = q - 1$. This algorithm may also be written symbolically as R rem P = R, U div P = Q.

Assuming that $\text{degr}(P) = n - k - 1$ so that $\text{degr}(R) < n - k - 1$, let $$\begin{aligned} T(x) &= x^{n-k}U(x) + R(x) \\ &= u_{k-1}x^{n-1} + u_{k-2}x^{n-2} + \ldots + u_0x^{n-k} + \\ & \quad r_{n-k-1}x^{n-k-1} + \ldots + r_1x + r_0. \end{aligned} \tag{3}$$

This corresponds, as usual, to augmenting a k-bit message $u=(u_{k-1}, u_{k-2}, \ldots, u_1, u_0)$ with an (n—k) bit error check signal $r=(r_{n-k-1}, \ldots, r_1 \cdot r_0)$ to produce an n-bit word $$t=(u_{k-1}, u_{k-2}, \ldots, u_1, u_0, r_{n-k-1}, \ldots, r_1, r_0),$$

with the corresponding polynomial T(x) representing the augmented message word.

Typically, an error in transmission or encoding can corrupt the augmented message word t so that the received word h, with associated polynomial H(x), does not correspond precisely to t. The polynomial difference T-H is an n-bit polynomial E and, because of the binary arithmetic rules, $$T+(T+E)=E=T+H.$$

Recall that the original message word is expressible as $$T = x^{n-k}U + U \text{ rem } P$$

so that $$T \text{ rem } p = (x^{n-k}U + U \text{ rem} P) \text{ rem } P = 0$$

and $$\begin{aligned} H \text{ rem } P &= (T+E) \text{rem } P = E \text{ rem } P \cdot \equiv \cdot S(x) \\ &= s_{n-k-1}x^{n-k-1} + s_{n-k-2}x^{n-k-2} + \ldots + s_1x + s_0, \end{aligned}$$

where S(x) is connoted the syndrome polynomial with corresponding syndrome $s=(s_{n-k-1}, S_{n-k-2}, \ldots, S_1, S_0)$. If the polynomial S(x) is identically zero, then either (1) E is a multiple of P (no protection is provided here, except reliance on the small probability of such misdetection) or (2) no error has occurred in encoding/transmission of the message word t and no correction is required. Any non-zero syndrome polynomial is attributable entirely to the error polynomial E(x), not to the original message word t or the corresponding polynomial T(x).

S was created or defined by modular division of E (unknown) by the polynomial P. If this modular division process can be reversed, the original error polynomial E(x) or corresponding error word e can be recovered. Assume that E(x) is expressible as $$E(x) = e_{r-1}x^{r-1} + e_{r-2}x^{r-2} + \ldots + e_m x^m,$$

where $e_{r-1}$ and $e_m$ are non-zero. A new sequence of polynomials is introduced, defined by $$E_1 = E \text{ rem } P = S$$

$$E_{j+1} = E_j \text{rem } P \; (j \geq 1)$$

$$S_j = E_{j+1}$$

If length $(e) = r - m < n - k - 1$, then for some positive integer $j_o$ $$S_{j_o}(x) = e_{s-1}'x^{s-1} + \ldots + e_1'x + e_0' (e_0' \neq 0, \; s < n-k)$$

and $S_{j_o}$ is the normalized error pattern, with $j_o$ being a pointer to the error pattern. With E determined, the corresponding received message h may be correctable. Barriers to error detectability and correctability are discussed by S. Lin and D. J. Costello in *Error Control Coding*, Prentice-Hall, 1982, pp. 58–68.

The generator polynomial P(x) is also referred to here as the "forward" polynomial, to distinguish it from the "reverse" polynomial $$P_r(x) = x^{n-k-1} P\left(\frac{1}{x}\right) =$$

$$p_0 x^{n-k-1} + p_1 x^{n-k-2} + \ldots p_{n-k-2} x + p_{n-k-1}.$$

Similarly, define the reverse syndrome polynomial as $$S_r(x) = x^{n-k-1} S\left(\frac{1}{x}\right) =$$

$$s_0 x^{n-k-1} + s_1 x^{n-k-2} + \ldots s_{n-k-2} x + s_{n-k-1}.$$

The invention set forth herein uses a syndrome of maximum degree $n-k=56$ for illustrative purposes, but this approach may be used for any other degree such as $n-k=32,40,48,64$, etc. The length of k of the data stream or received message w is likewise arbitrary; in practice, k might be $(8) \cdot (256) = 2048$ or $(8) \cdot (512) = 4096$ or any other large number that is expressible as a multiple of a byte of eight bits.

FIGS. 1a–1i illustrate a portion of the implementation of the invention with $n-k=56$ and with the choice $$P(x) = x^{52} + x^{50} + x^{43} + x^{41} + x^{34} + x^{26} + x^{24} + x^8 + 1$$

for the generator polynomial. Other suitable choices of the polynomial are $$P(x) = x^{43} + x^{41} + x^{34} + x^{32} + x^{28} + x^{26} + x^{25} + x^{21} + x^{19} + x^{15} + x^{10} + x^6 + x^2 + x^1$$

for $n-k=48$, or $$P(x) = x^{28} + x^{26} + x^{19} + x^{17} + x^{10} + x^6 + x^2 + 1,$$

for $n-k=32$. The choice of P is not a central part of the invention described here, but some choice of P must be made. Conceptually, the equation $S = E \text{ rem } P$ has the solution $E = (S_{j_o})_r \text{ rem } P_r$; this approach is used for the error correction procedure adopted here.

Division by P(x) (or by $P_r(x)$) is implemented in the following manner, as discussed by Neal Glover in *Practical Error Correction Design for Engineers*, published by Data Systems Technology, 1982, pp. 19–92. FIGS. 1a–1g collectively show a linear feedback shift register LFSR used in one embodiment of the invention. In FIGS. 1a–'1i, the data are passed through a linear feedback shift register LFSR having $n-k=56$ bits of capacity, with the current LSB residing at bit position 0 and the current MSB (of the 56-bit word contained in the LFSR) residing at bit position 55. As each clock pulse is received by each of the bit positions, the contents of bit position m would normally be shifted "left" to bit position $m+1$ ($m=0, 1, 2, 3, \ldots, 54$), and the MSB would be shifted out for further processing. For each nonzero coefficient $P_{m+1}$ of the generator or forward polynomial P(x) (or $P_r(x)$), the bit at position m is first passed to one input terminal of a two-input exclusive OR gate (denoted "XOR" or "$\oplus$" herein), whose other input signal is high ($=1$) if a certain signal O11 XOR $q_{55}*$(O11 is generated from FIG. 2 and $q_{55}$ is the MSB of the LFSR) is high, feedback is enabled, and the polynomial P(x) (or $P_r(x)$) is activated, and is low ($=0$) otherwise; the output signal of this XOR gate is passed to bit position $m+1$. The signal O11 is discussed below. This implements division by P(x) (or $P_r(x)$), if that function is activated; otherwise, the contents of bit position m are shifted to bit position $m+1$ as if the XOR gate isn't present, with no change in the shifted value.

Before the hardware arrangements are discussed, some of the external inputs (from the outside world) are identified and discussed. The system operates in three modes. The first mode, encode, involves the calculation of the remainder of the polynomial U(x), as discussed above, to form an augmented message polynomial T(x). In the encode mode, the system is writing data and the write gate signal wrg is high, indicating that the network should calculate the remainder R and thus create T.

In the second mode, decode, the network is being used for error detection and H rem $P = S$ is being determined. In this mode, the system is reading data and the read gate signal rdg is high. The signals wrg and rdg are never high simultaneously, but the two signals can be simultaneously low: rdg* = weg* = 1, wher A* denotes the Boolean complement of the Boolean variable A(ox=1 and 1*=O at the bit level).

A third input signal, operative in either the encode or the decode mode, is out·ecc. This signal is used to switch the serial data output stream from the original message u to the remainder r that was (previously) calculated in the linear feedback shift register LFSR shown in FIGS. 1a–1i. The signal out.ecc, when high, disables the operation of division by P (or by $P_r$ or $P_{crc}$) in, or the operation of feedback to, the LFSR. This signal also switches the input of the data output portion of the network.

A fourth input signal, seq.ecc, is used to stop calculations in the decode mode. A fifth input, crc.sel, indicates that the polynomial used for division in the ecc circuit should be, not P(x) or $P_r(x)$, but a predetermined 16-place (degree $\leq 15$) polynomial $P_{crc}(X)$ that is used to run detection error checks (with rdg=1) on the received message word h and the encode the original message word t. The use of a CRC polynomial for error checks is well known in the art; it is rare that correction is attempted on detected errors. Two suitable, well known examples of CRC polynomials are $$P_{crc}(x) = x^{12} + x^5 + 1$$

and $$P_{crc}(x) = x^{15} + x^2 + 1.$$

The third mode is the (error) correction mode, which becomes operative after an error has been detected but not yet identified. In this mode, rdg=wrg=0. The first of the inputs in this mode is clear·ecc, which will set the LFSR bit contents to ones if rdg=wrg=0. A second input in this mode is $\mu$·fdb; when this signal is high and rdg=wrg=0, the feedback signal is disabled, as in the polynomial division operation in the LFSR. The $\mu$·fbd signal plays a fundamental role in the syndrome capture and reversal phase of the correction mode.

A third input signal in the correction mode, ecc·dir, determines whether P(x) or $P_r(X)$ will be used for division in the LFSR. The reverse polynomial is typically used only in the error pattern computation phase of the correction mode. A fourth input signal, correct, is used to switch the functionality of register $72_H$ (i.e., with the number 72 expressed in hexidecimal rather than decimal notation) between a counter (correct=1) and a shift register (correct=0) in the attempted correction of an error. A fifth input signal, ecc·shift·enable specified by the microprocessor to enable either an eight-bit shift (correct=0) or a 256-byte correction attempt, as discussed below (correct=1); this bit is reset when the enabled operation is completed.

Figure 2:
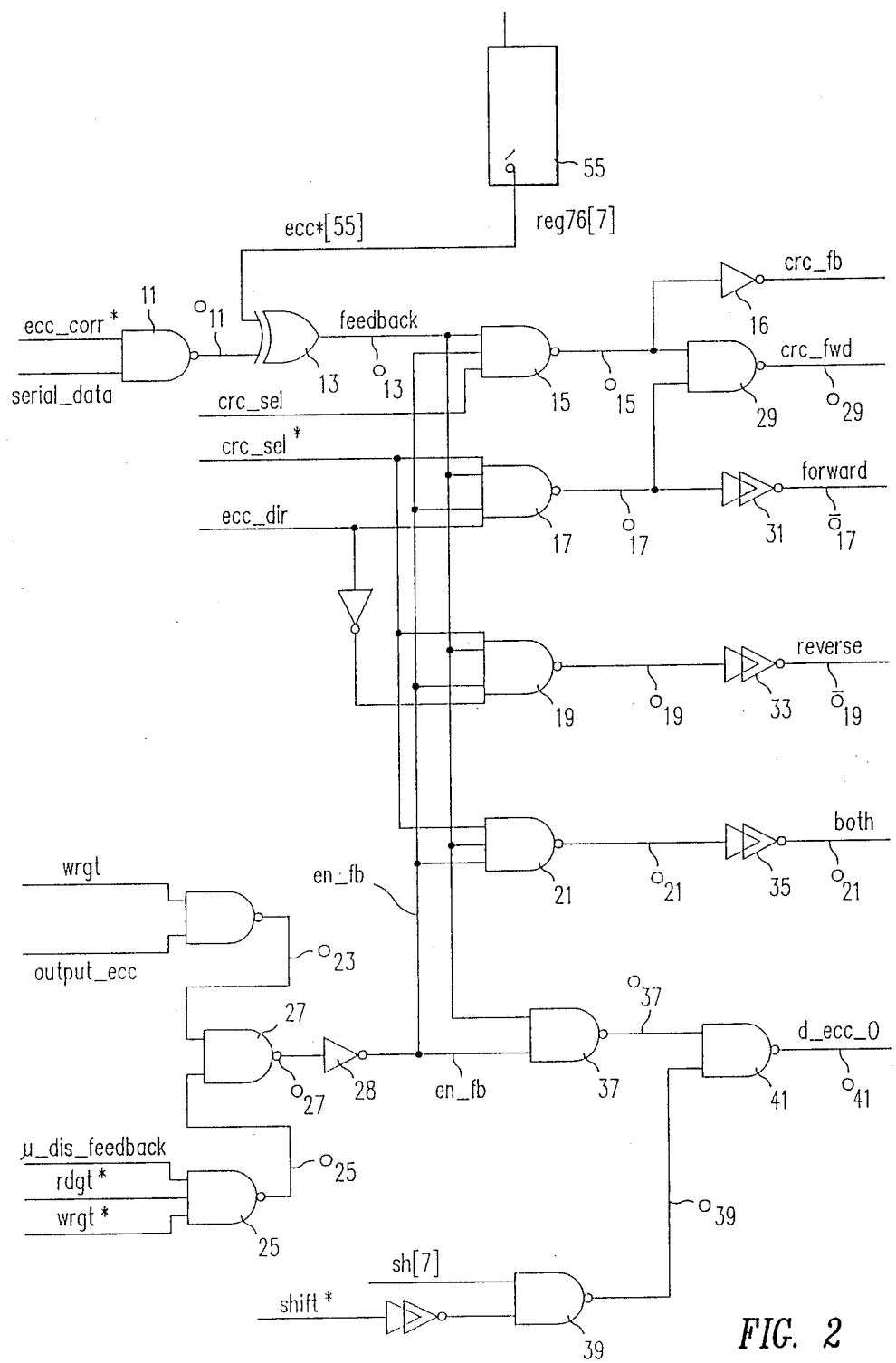
FIG. 2 is a schematic view of the feedback enable/disable and division polynomial selection circuits contained within the dashed line area in FIGS. 1a, 1b and 1c which is labeled with the reference character 2'.

In the error detection mode, the augmented data stream ADS, consisting of the (encoded) k message bits followed by the n−k syndrome bits, enters a NAND gate 11 in FIG. 2; this gate also receives an input signal ecc·corr* that is set=0 only in the correction mode; here, ecc·corr*=1. If an error was detected previously and correction is required, this indicates that the correction mode should be entered and ecc·corr* should be set=0. Using the DeMorgan logical implication laws, the output $O_{11}$ of the gate 11 is $$O_{11} = ((ADS) \cdot (ecc\text{·}corr^*))^* = ADS^* + ecc\text{·}corr,$$

were the usual rules for bit-by-bit logical OR (addition) and AND (multiplication) operations apply, viz:
0+0=0,
1+1=1,
1+0=0+1=1,
0·0=0·.1=1·0=0,
1·1=1.

The output signal $O_{11}$ of gate 11 is fed to an XOR gate 13 that also receives the MSB ($q_{55}$*) from the 7-byte or 56-bit linear feedback shift register LFSR that will be described below. The output signal $O_{13}$ of the gate 13 is $$O_{13} = O_{11} XOR\ q_{55}^* = O_{11} \cdot q_{55} + O_{11}^* \cdot q_{55}^*.$$

Output signal $O_{13}$=1 indicates that feedback is required for processing the ADS. The signal O11 contains the input data stream to be processed (shifted or divided) in the LFSR; in the correction mode, the serial data contributions are disabled by the choice ecc·corr*=0 ($O_{11}$=1), and the feedback signal becomes $$O_{13} = q_{55}.$$

The output signal $O_{13}$ is fed to each of four three-input NAND gates 15, 17, 19 and 21 that determine which polynomial is activated in the LFSR. A second input signal to NAND gate 15 is crc·sel*, which is low if the CRC option is selected, as discussed above. Such polynomials and their uses are well know in the art of error control coding. A third input signal to NAND gates 15, 17, 19 and 21 is an enable feedback signal $O_{28} = O_{27}^* =$ enfb that is the inverted output, from an inverter 28, of a two-input NAND gate 27. The enable feedback signal enfb is inactive only during the augmentation phase of the encode mode, when wrg=out·ecc=1, or during the syndrome capture/reversal phase of the correction mode, or when wrg=rdg=$\mu$·fbd*=0. The output signal at each of the four NAND gates 15, 17, 19 and is low only if $O_{13}$=1 (feedback active) and enfb=1.

The gate 27 receives as input signals the output signals $O_{23}$ and $O_{25}$ of two NAND gates 23 and 25 as shown. NAND gate 23 receives two input signals, wrg and out·ecc (command output ecc), as inputs. The signal wrg is high during a write operation (encode mode); and when the out·ecc signal is also asserted (both signals high), the enable feedback signal enfb, as discussed below, is low and the 56-bit word contained in the LFSR is appended to or augments the data stream NAND gate 25 receives three input signals, $\mu$·fbd, rdg* and wrg*, as inputs. The feedback disable signal $\mu$·fbd is bit r=1 of an eight-bit (r=0,1,2, . . . , 7) register $71_H$.

The output signal $O_{23}$ is low only if wrg and out·ecc are both high. The output signal $O_{25}$ is low only if $\mu$·fbd and rdg* and wrg* are all high. The output signals $O_{23}$ and $O_{25}$ serve as inputs to the NAND gate 27, which is then inverted by an inverter 28 to produce the enable feedback signal enfb or $$enfb = O_{23} \cdot O_{25} = (out\text{-}ecc^* + wrg^*) \cdot (\mu\text{·}fbd^* + rdg + wrg).$$

The enable feedback signal enfb is high, indicating that serial feedback from the LFSR is selected, only if (1) wrg=0 or out·ecc=0 and (2) $\mu$·fbd=1 or rdg=1 or wrg=1.

The NAND gate output signal $O_{15}$ is low only if the signals $O_{13}$, $O_{27}$* and crc·sel are high, indicating that the CRC option is selected, feedback is enabled and a feedback signal ($O_{13}$) is present. The NAND gate 17 receives input signals $O_{13}$, crc·sel*, ecc·dir* and enfb, and its output signal $O_{17}$ is low only if each of these four input signals is high. The forward polynomial P(x) is selected if ecc·dir=0, and Pr(x) is selected if ecc·dir=1. Similarly, the output signal $O_{19}$ from the NAND gate 19 is low only if the signals $O_{13}$, crc·sel*, ecc·dir and enfb are all high.

The NAND gate 21 receives input signals $O_{13}$, crc·sel* and enfb, and its output signal $O_{21}$ is low only if each of these three signals is high. The three output signals $O_{17}$, $O_{19}$ and $O_{21}$ are each inverted by respective inverters 31, 33 and 35 to produce the respective output signals $O_{17}$*=forward, $O_{19}$*=reverse, and $O_{21}$*=forward/reverse (or "both"). The signals $O_{15}$ and $O_{17}$ are fed to a two-input NAND gate 29 that produces an output signal O6hd 29=$O_{15}$*+$O_{17}$*=crc·forward.

Output signal $O_{15}$ is inverted by an inverter 16 to produce a CRC feedback signal $O_{15}$*=$O_{16}$=crc·fb that is high only if the CRC polynomial is selected and feedback is present. Output signal $O_{17}$*=forward is high only if the forward polynomial is selected. Output signal $O_{19}{}^*$=reverse is high only if the reverse polynomial is selected. Output signal $O_{21}{}^*$="both" is high only if either the forward or reverse polynomial is selected. Output signal $O_{29}=(O_{15}\cdot O_{17})^*$=crc-forward from NAND gate is active only if either the CRC or forward polynomial is selected. Note that "both" and crc-forward cover bit positions in the LFSR where the various polynomials overlap. As noted above, each of the output signals $O_{15}$, $O_{17}$, $O_{19}$ is low only if enfb=$O_{27}{}^*$=1 and $O_{13}$=1 (feedback is active). Each of the output signals crc-forward, crc-fb, forward, reverse and "both" controls or activates several XOR gates at predetermined bit positions in the LFSR in FIGS. 1a–1i, to implement division by the CRC, forward or reverse polynomials.

The output signals $O_{13}$ and enfb are fed to a two-input NAND gate 37 that produces an output signal $O_{37}=O_{13}{}^*$+enfb*, which is low only if enfb=1 and feedback is active. A NAND gate 39 receives two input signals, shift and sh[7], and produces an output signal $O_{39}=$(shift·sh[7])*, with the output signals $O_{37}$ and $O_{39}$ being fed to a two-input NAND gate 41 to produce an output signal $O_{41}$=d·ecc·$\phi$ that is fed to the input terminal of bit 0 of the LFSR. The signal shift=correct+ecc·corr*, where the condition correct=0 indicates that register $72_H$ is used as a shifter rather than as a counter; and sh[7] is the output MSB signal, $q_7$, of register $72_H$. The correct* signal is high if the data bits contained in the register $72_H$ are to be shifted serially into the LFSR at the LSB position and the data bits in the LFSR are to be shifted serially through the LFSR in the order bit m→bit m+1 (m=0, 1, ..., 54). The output signal $O_{41}$=shift·sh[7]+$O_{13}$·enfb is high if shift and sh[7] are both high, or if the feedback signal enfb and the feedback active signal $O_{13}$ are both high.

FIGS. 3A, 3B, 3C, 3D and 3E show schematically the logic of the routine for error detection and correction, if the error is correctable. Let k=8K (K a positive integer) be the message length and let n−k=56 for purposes of illustration. The device initially transfers into the LFSR a stream of A+K+7 bytes, where A is the number of address mark bytes required (e.g., two) and 7 is the length in bytes of the ecc remainder. The syndrome bytes in s are now examined to determine if a detectable error in transmission/receipt has occurred. If such an error has occurred, bit 2 of register $79_H$, also labeled ecc error and written symbolically here as REG79$_H$<2>, is set high; and the error correction mode is activated by the microprocessor. The seven bytes residing in the LFSR (for the choice n−k=56) represent the syndrome, but the order of the syndrome bits should be reversed to speed the correction process.

First store the contents of registers $73_H$, $74_H$, $75_H$, and $76_H$ in RAM locations M+3, M+4, M+5 and M+6, respectively (M fixed); these four registers contain the bits 24–31, 32–39, 40–47 and 48–55, respectively in the LFSR. Now set the eight-bit contents, expressed in hexidecimal form, of control register $71_H$ equal to $06_H$, written symbolically as REG71$_H$<7-0>=$06_H$; this disables the enable feedback signal enfb and shifts the LFSR contents upward one byte (bit m→bit m+8) and shifts REG72$_H$<0-7> into bit positions 0–7 of the LFSR. The procedure of this paragraph is repeated twice so that registers $75_H$, $74_H$ and $73_H$ now contain the three least significant bytes of the original syndrome sequence s. Register contents REG73$_H$<0-7>, REG74$_H$<0-7> and REG75$_H$<0-7> are stored in RAM locations M, M+1 and M+2, respectively.

Now the syndrome must be reloaded into the LFSR. At the end of this operation, the syndrome will be bit reversed, where bit position 55 of S=bit position 0 of $S_r$,
bit position 0 of S=bit position 55 of $S_r$.

To reload the syndrome, write the contents of RAM location M into register $72_H$. Set REG 71$_H$<7-0>=$06_H$; this will shift the contents of register $72_H$ into the LFSR (shifting the LFSR contents appropriately, with bit m→bit m+8). When bit 1 of register $71_H$ has been cleared, this step is completed and another shift can be started. This step is repeated serially for RAM locations M+1, M+2, ..., M+6 to complete the syndrome reversal in the LFSR. The syndrome polynomial in the LFSR now corresponds to $S_r$.

The error correction procedure, illustrated symbolically in FIGS. 3B, 3C, 3D and 3E, begins by setting a block counter BC=0 initially. BC counts the number of blocks (of 256 bytes each) that have been processed. The maximum number of bytes MB to be shifted is MB=A+K+10, which is three bytes more than the original (augmented) message; these three extra bytes are required by the implemented error trapping mechanism. The number $83_H$ is now written into control register $71_H$. This selects the reverse polynomial correction function and begins dividing the contents of the LFSR by $P_r(x)$. Register $72_H$, which has been automatically cleared, now becomes a counter and counts the number of byte division operations performed. After REG71$_H$<1> is cleared, if REG79$_H$<3>=0, no correctable error has been found yet; increment the block counter (initially BC=0). REG79$_H$<3>=correctable=1 indicates that a correctable error may have been found. If BC·256<MB, re-enter the number $83_H$ in register $71_H$ and begin dividing the contents of LFSR again. Register $72_H$ is again cleared and continues to function as a counter. After REG71$_H$<1> is again cleared, re-examine REG79$_H$<3>. If this bit value is 0 and BC·256<MB, continue the cycle.

As the recycling continues, one of two events occurs: (1) BC·256>MB, in which event sufficient shifts have been performed and the detected error is not correctable; or (2) REG79$_H$<3>=1, in which event a correctable error may have been found. One then exits from the loop and continues with the correction routine. If this second event occurs, the number of byte division operations that were made is B=BC·256+[binary value of register 72 contents], if this "binary value" is nonzero (i.e., 0<"binary value"≦255); if the "binary value" is zero, then set B=BC·256+256. If B>MB the error is again uncorrectable. If the computed value B is less than or equal to 10, the error is in the ecc field, not in the message itself, and can be ignored.

Assuming 11≦B, the error is in the message field and may be correctable in the following manner. First calculate the displacement $$D=K-(B-10).$$

At this point the (correctable) error pattern has length at most 22, and this requires at most four bytes to hold, namely RAM locations D, D+1, D+2, and D+3, corresponding to the registers $73_H$, $74_H$, $75_H$ and $76_H$, respectively. For the error pattern in register $73_H$: if D≧K, the error is in the ecc and one stops; if D<0, increment D and transfer to (the next) register 74; if 0≦D<K, replace the contents of RAM location D by <D> XOR REG73$_H$<0-7>, where <D> is the bit-by-bit contents of RAM location D, and then increment D. For the error pattern in register $74_H$: if $D \geq K$, the error is in the ecc field and one stops; if $D < 0$, increment D and transfer to register $75_H$; if $0 \leq D < K$, replace $<D>$ by $<D>$ XOR $REG74_H<0-7>$ and then increment D. For the error pattern in register $75_H$: if $D \geq K$, the error is in the ecc field, and one stops; if $D < 0$, increment D and transfer to register $75_H$; if $0 \leq D < K$, replace $<D>$ by $<D>$ XOR $REG75_H<0-7>$ and then increment D. For the error pattern in $76_H$: if $D \geq K$, the error is in the ecc field and one stops; if $D < 0$, one stops; if $0 \leq D < K$, replace $<D>$ by $<D>$ XOR $REG76_H<0-7>$ and stop.

If an error pattern is found, the eight-bit contents of each of the registers $73_H$, $74_H$, $75_H$ and $76_H$ will have a bit b=1 at each bit location where an error occurs, and nowhere else. Thus, if one forms the bit-by-bit XOR combination of RAM location D+i with register $(73+i)_H$ (i=0,1,2,3) the result is an eight-bit word, and an individual bit or RAM location D+i is changed only if the corresponding bit in register $(73+i)_H$ is a one, indicating that an error has been identified at that bit location: $b \oplus 0 = b$ and $b \oplus 1 = b^*$ for any bit value in b. The result of the foregoing procedure is that the bit contents of RAM locations D, D+1, D+2 and D+3 are now corrected.

Figure 4A:
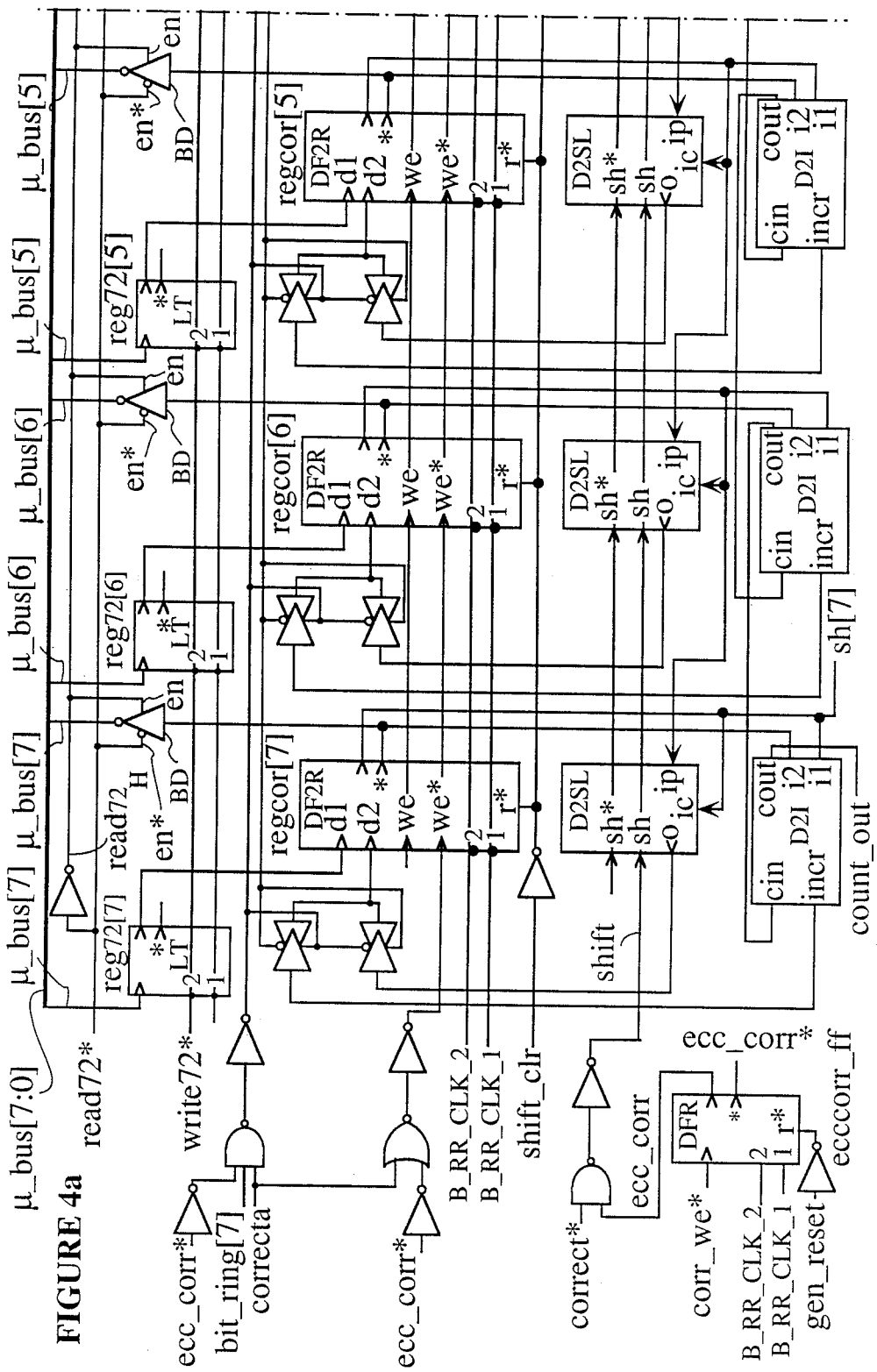
FIGS. 4a, 4b and 4c when arranged in the manner illustrated in FIG. 4, functions alternately as a shifter and as a counter in the error detection/correction approach discussed herein.
Figure 4B:
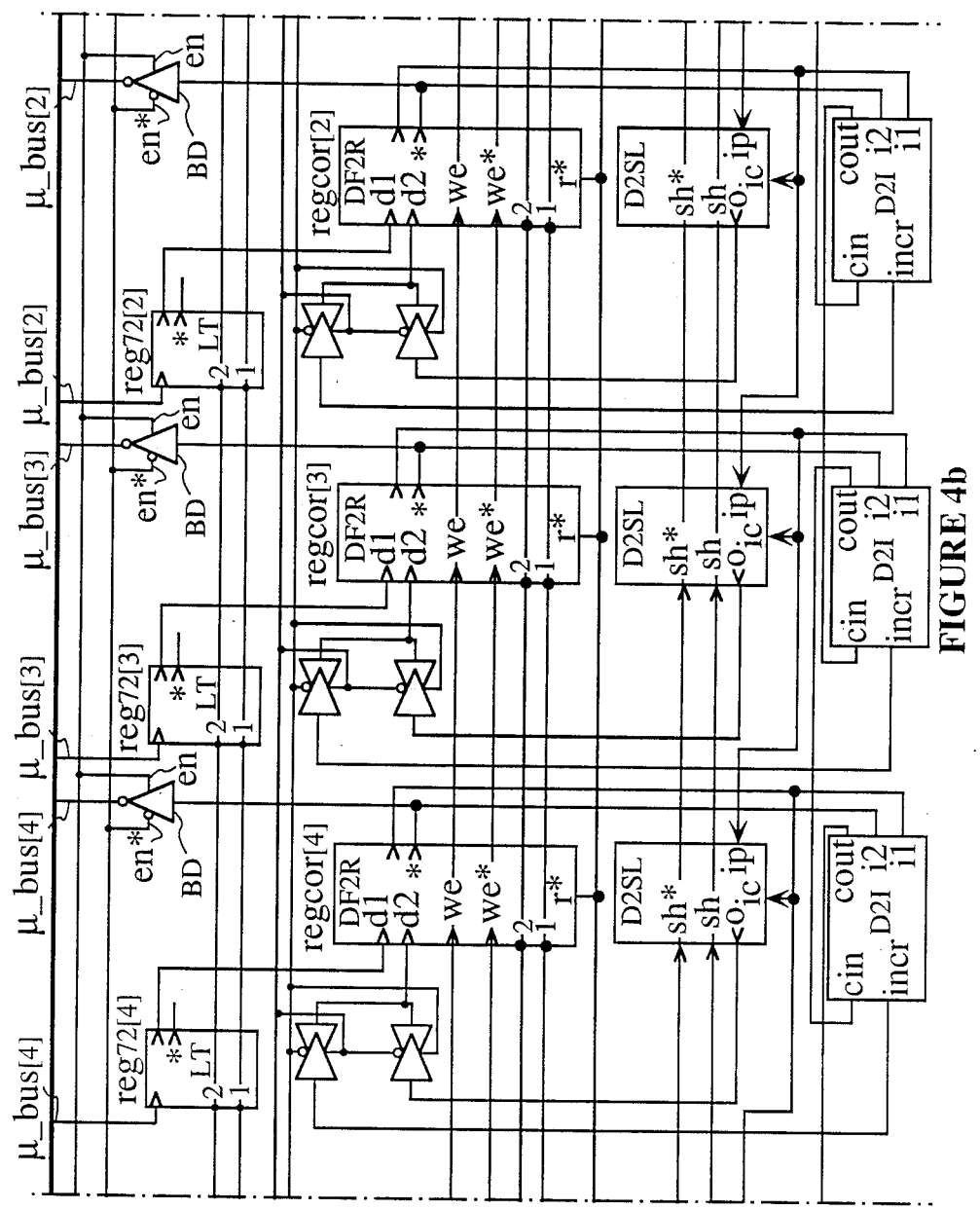
Figure 4C:
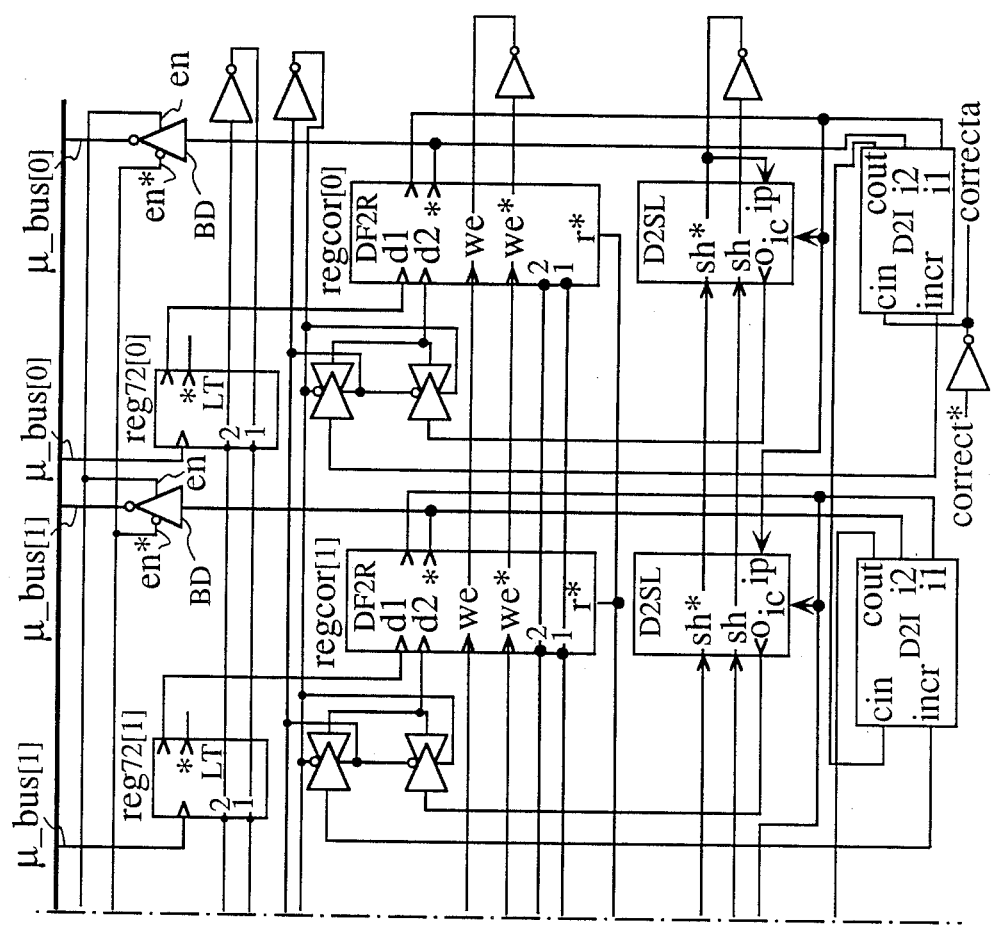

Register $72_H$ functions alternately as a shift register or as a counter and is an important feature of the invention. FIGS. 4a–4c are a schematic view of the register $72_H$ and some associated circuits, showing all interconnections and input signals. This register comprises eight single-bit processor units, numbered 0, 1, 2, ..., 7, plus a particular arrangement of NAND, NOR and inverter gates shown at the left in FIG. 4a, plus a master-slave flip-flop, labeled DFR, plus six input signals and three output signals and several μbus data lines. Each of the eight processor units comprises: a bus driver, labeled BD; a simple latch, labeled LT; a multiplexed, two-input, master-slave flip-flop or data storage cell, labeled DF2R; a two-input, shift left cell, labeled D2SL; a two-input counting cell, labeled D2I; and a two-input multiplexer, labeled MUX and created from two transmission gates, with appropriate interconnections as shown. Each processor unit processes data in a single-bit stream. The internal details of the cells DF2R, D2SL and D2I are shown schematically in FIGS. 5, 6 and 7, respectively, and are discussed below. For ease of reference, BD no. r, LT no. r, DF2R no. r, D2SL no. r and D2I no. r (r=0, 1, 2, ..., 7) will be said to be "associated" with one another. One advantage of the invention disclosed herein is that register $72_H$ can operate as a shifter, using the LT, DF2R and D2SL of each processor; or the register $72_H$ can operate as a counter, using the D2I and DF2R cells.

FIG. 5 shows the structure of a DF2R cell, a two-input data storage cell with reset capability, in detail. A first signal d1 is received by the DF2R cell as the output signal $q_{LT}(t)$ from the associated latch LT shown in FIGS. 4a–4c. The eight latches LT receive the eight bits of a byte from eight local microprocessor bus data lines (μbus) and latch the input signal in a standard manner. A latch LT receives a stream of data signals from a μbus data line at the LT data input terminal and receives two control input signals write72 and write72* at two control input terminals; only one of these signals write72 and write72* is necessary, since inversion can be performed inside the latch as well. If write72=1, the latch passes its most recently read data bit to the output terminal; if write72=0, the data bit currently at the output terminal remains in place.

Each of the eight processor units (r=0,1,2, ...,7) of the data register $72_H$ also includes a bus driver, BD in FIGS. 4a–4c, that reads the signal $q_{DF2R}*$ appearing at the output terminal of the associated DF2R cell, inverts this signal and writes the result $q_{DF2R}$ onto the μbus data line. The bus driver BD receives two control input signals, read72 and read72*, at two control input terminals labeled en and en*, respectively, and receives the data input signal $q_{DF2R}$ from the DF2R cell; receipt of (only) one of the signals read72 and read72* is sufficient, as with the signal write72 above. If read72=0, the current signal is blocked; read72 would be held high when register $72_H$ is to be read by the microprocessor.

Figure 8:
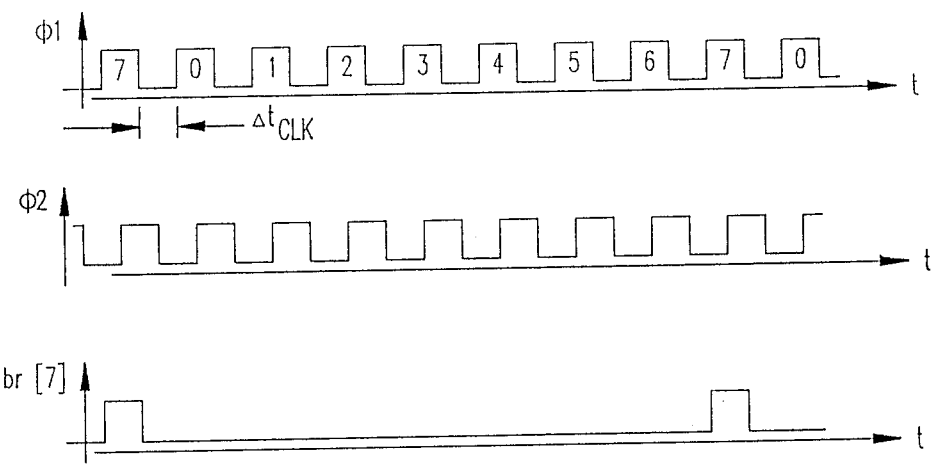
FIG. 8 is a graphic view of the clock phase signals $\phi 1$ and $\phi 2 (= \phi 1^*)$ and bit ring signal br[7] associated with the clock driver for the system.

A second signal d2 is received by the DF2R cell from another source, discussed below. The first input signal d1 is admitted by the DF2R cell at gate B if load*=0, where load*=ecc·corr +correct is a control signal that is low if the system is in the correction mode or if register $72_H$ operates as a counter; and the second signal d2 is admitted by the DF2R cell at gate A if load*=1. Precisely one of these two signals d1 and d2 is admitted during any clock pulse interval, determined by a full cycle of the input clock signal $\phi 1$ or $\phi 2$, where $\phi 2$ is substantially the complement of $\phi 1$ as shown in FIG. 8.

Within the DF2R cell, the admitted signal d(t) (d1 or d2) encounters a first transmission gate C, which bars passage of the signal d(t) if $\phi 1=0$ ($\phi 2=1$) and transmits the signal d(t) if $\phi 1=1$ ($\phi 2=0$). If, at a particular time, a signal d(t) is transmitted by gate C (because $\phi 1=1$), this signal will be blocked by gates D and E, which require $\phi 1=0$ for transmission. The result of this is that the signal d(t) is held but not recirculated in the loop including the inverters I1 and I2 and the gate D until the clock phase changes again from $\phi 1=1$ to $\phi 1=0$. When this phase change occurs, $\phi 1=0$, gate C closes and gates D and E open so that the signal d(t) is now transmitted beyond gate E; the time is now $t+\Delta t_{CLK}$ and a new signal $d(t+\Delta t_{CLK})$ arrives at and is blocked by gate C. For ease of reference, the time variable t will be replaced by a dimensionless variable $t' = t/\Delta t_{CLK}$, with $(t \pm \Delta t_{CLK})/\Delta t_{CLK} = t' \pm 7$.

The signal d(t') is now inverted by inverter I3, and the resulting signal d(t')* appears at the output terminal q* of the DF2R cell. The signal d(t')* is inverted again by inverter I4, and the resulting signal d(t') appears at the output terminal q of the DF2R cell. This signal q is also held or recirculated in a feedback loop (I3,I4,F) with transmission gate F that transmits only for $\phi 1=1$. The DF2R cell thus admits a signal d1(t') or d2(t') according as load=0 or load=1; the previously admitted signal is delayed by one clock period and then appears at the output terminal 1 of the DF2R, according as $\phi 1(t')=1$ or $\phi 1(t')=0$.

FIG. 5 exhibits a two-input data storage cell without set or reset capability. Reset capability may be included by replacing each of the inverters I1 and I3 by a two-input NAND gate (not shown), with a second input being a reset signal r*=shift·clear* (normally high) as shown in FIGS. 4a–4c. Set capability may be included by replacing, instead, each of the inverters I2 and I4 by a two-input NAND gate (not shown) with a second input being a set signal (normally high). These remarks on set and reset capability also apply to the descriptions of the DFR and DFWR cells below.

The input signal d2 at gate A is itself the output signal of a multiplexer ("MUX") G that comprises two transmission gates H and J operated in tandem. The gate H receives a gating input signal incr/shift at its direct terminal and a gating signal incr/shift* at its inverted terminal; the gate J receives a gating input signal incr/shift* at its inverted terminal and a gating input signal incr/shift at its direct terminal. Thus, gate H transmits if incr/shift=1 and gate J transmits if incr/shift=0. The signal incr/shift is the inverted output signal of a NAND gate 42, viz.

incr/shift=(ecc·corr)·(br[7])·(correct).

Figure 6:
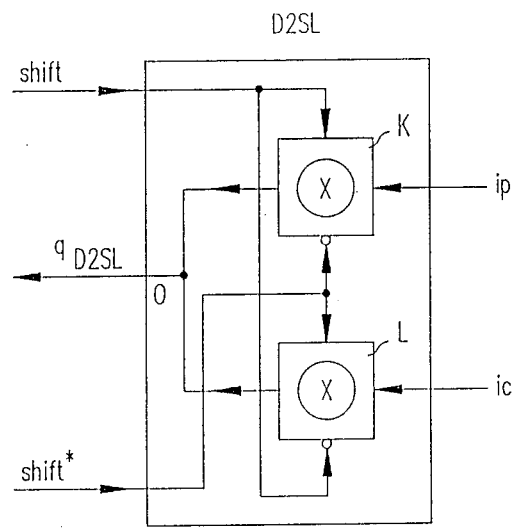
FIG. 6 is a detailed schematic view of one of the D2SL left shift cells used in FIGS. 4a, 4b and 4c.
Figure 7:
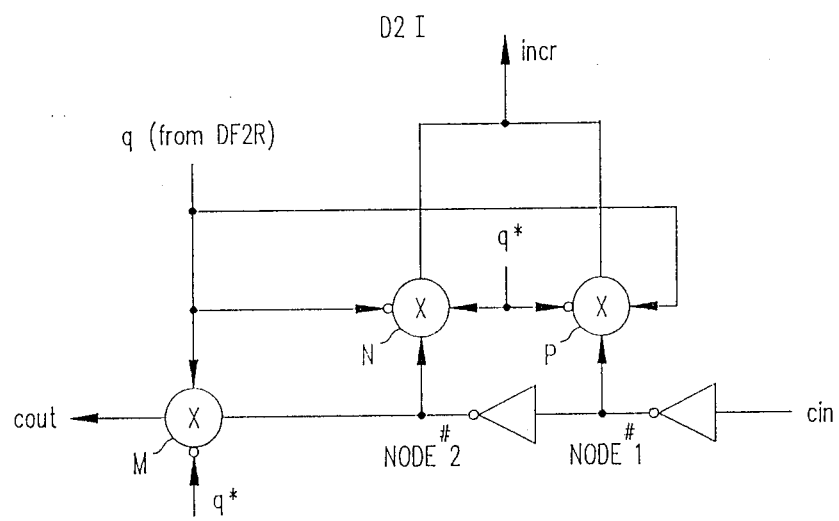
FIG. 7 is a detailed schematic view of one of the D2I counting cells used in FIGS 4a, 4b and 4c.

The input signal, incr, fed to the gate H is received from the associated increment counting cell D2I, as shown in FIG. 7. The input signal, $O_{D2SL}$ to the gate J is received from the associated shift cell D2SL, as shown in FIG. 6. The output signal, at terminal $q_{DF2R}$ of the DF2R cell, is a delayed function of the data input and gating input signals, as illustrated in Table 1 below.

TABLE 1

| load | incr/shift | d(t) (input) |
|---|---|---|
| 0 | 0 | d1 = $q_{LT}(t')$ |
| 0 | 1 | d1 = $q_{LT}(t')$ |
| 1 | 0 | d2 = $O_{D2SL}(t')$ |
| 1 | 1 | d2 = incr(t') |

The shift cell D2SL, shown in FIG. 6, is similarly constructed. A transmission gate K receives the signals ip, shift and shift* and is transmitting only for shift=1. A transmission gate L receives the signals ic, shift* and shift and is transmitting only for shift*=1. Thus, the output signal $O_{D2SL}$ in the D2SL shift cell is $O_{D2SL}$=ip if shift=1 and is $O_{D2SL}$=ic if shift*=1. The signal ip represents the immediately preceding value of the q output signal of the preceding DF2R cell, denoted $q_{DF2R}^{(r-1)}$ (for units r=1,2,...,7), as indicated by FIG. 5; and the signal ic represents the current value of the q output signal of the corresponding DF2R cell. The input ip to D2SL (processor unit r=0) may be grounded Thus, the output of the D2SL cell is, Output $O^{(r)}_{D2SL}$
$= q^{(r)}_{DF2R}$ if shift* = 1
$= q^{(r-1)}_{DF2R}$ if shift = 1 where $O_{D2SL}^{(r)}$ denotes the O terminal output signal of D2SL shift cell in unit no. r. Table 2 illustrates the output signal $O_{D2SL}$, as a function of the data input and gating input signals.

TABLE 2

| shift | ip | ic | D2SL Output |
|---|---|---|---|
| 0 | x | 0 | 0 |
| 0 | x | 1 | 1 |
| 1 | 0 | x | 0 |
| 1 | 1 | x | 1 |

The counting cell D2I shown in FIGS. 4a–4c is shown in greater detail in FIG. 7. A transmission gate M receives the gating signals q and q* (from the associated DF2R cell) at its "high" and "low" terminals, respectively, so that gate M is transmitting only if q=1. Similarly, gate N is transmitting only if q*=1, and gate P is transmitting only if q=1. If the input signal cin is 1 (0), its inverted value at node #1 is 0 (1), and the doubly inverted value at node #2 is 1 (0). The input signal cin, received at $D2I^{(r\geq 1)}$, is the output signal cout produced at $D2I^{(r-1)}$; with cin=correct at $D2I^{(r=0)}$. One easily verifies that the following Table 3 exhausts all possibilities for the output signals cout and incr arising from the input signals 1 and cin.

Table 3

| input | | output | |
|---|---|---|---|
| q | cin | incr | cout |
| 0 | 0 | 0 | 0 |
| 0 | 1 | 1 | 0 |
| 1 | 0 | 1 | 0 |
| 1 | 1 | 0 | 1 |

The array of cells D2I is activated by receipt of an initial signal correct=1 at register $D2I^{(r=0)}$. From Table 3 above it is easily verified that the D2I outputs are determined by the normal binary arithmetic relations incr=q⊕cin (binary sum with carry), cout=q·cin (carry out), where ⊕ denotes the exclusive or (XOR) operation. The eight D2I single-bit counting cells that comprise a portion of register $72_H$, operate together as a serial counter with binary counting functions (incr) and carry over functions (cout). When the eight D2I counting cells are all filled with ones, the next increment cin=1 or q=1 at the LSB cell, #0, will change the contents of each such cell D2I to a zero and produce an output signal count·out=1 at the MSB counting cell, $D2I^{(r=7)}$. At this point, the collection of D2I counting cells recycles and (re)initializes itself. The signal count·out is high only at this time, and this signal may be used to terminate a counting process n=$n_{initial}$=0,1,2, ... , $n_{limit}$=255. If one wishes to change $n_{limit}$ to some other number such as $n_{limit}=2^q-1$ one merely provides a combination of q of the single-bit processor units, connected together as indicated in FIGS. 4a–4c, rather than eight such processor units; but the choice q=8 or a multiple of 8 is preferred here.

The signal ecc·corr is high if the circuit is in the correction mode. The signal correct is high if and only if register $72_H$ is to operate as a counter; if this occurs, the signal correct=1 is delivered to the input terminal cin on cell $D2I^{(r=0)}$ in FIG. 7 and, as noted above, the eight-bit register $72_H$ becomes a counter with initial value 0 and final value 255.

Bits 7-0 (or, more generally, q−1−0) contained in the register $72_H$ represent the MSB, MSB−1, ..., LSB, respectively, of the byte to be shifted into the ecc registers that comprise the LFSR. More specifically, when the contents REG$72_H$<7-0> are transferred into the LFSR, these bits are transferred to bit positions #7,#6, ..., #0 of the LFSR in that order.

The DFR cell shown in FIG. 4a is similar to the DF2R cell discussed above, except that the DFR cell has a single data input signal corr·we plus the same clock gating signals $\phi 1$ and $\phi 2$. The output signals $q_{DFR}$=ecc·corr and $q_{DFR}^*$ of this cell thus represent mere clock delays for the input signal corr·we and its complement The DFR cell, shown in FIG. 9 in more detail, thus operates as a storage delay element. The DFR cell with reset capability comprises a first transmission gate tr1 arranged in series with a first feedback loop, including a two-input NAND gate n1 (whose other input signal is a reset signal r* that is normally high), an inverter inv1 and a second transmission gate tr2, arranged in series with a third transmission gate tr3, arranged in series with a second feedback loop that includes a second two-input NAND gate n2 (with r* as the other input signal thereto), a second inverter inv2 and a fourth transmission gate tr4. All four transmission gates here are controlled by the clock phases, with tr1 and tr4 (tr2 and tr3) being transmitting for $\phi 1 = 1$ ($\phi 2 = 1$). The DFS cell shown in FIG. 10, which has set rather than reset capability, functions similarly, with the second input being delivered to the set (rather than reset) pin.

From FIGS. 4a–4c one notes that the following signals serve as data input signals or gating input signals for the DF2R, D2SL and DFR cells:

$$a = incr/shift = (ecc\cdot corr)\cdot br[7]\cdot correct$$

$$load^* = correct + ecc\cdot corr,$$

$$shift = (correct^*)\cdot(ecc\cdot corr) = (correct + ecc\cdot corr^*)^*.$$

With reference to FIG. 5, the transmission gate combination A and B within the DF2R cell admits the input signal $d1(t') = q_{LT}(t')$ only if $load^* = 1$; that is, only if correct = 1 or ecc·corr = 1. If correct = ecc·corr = 0, the DF2R cell will admit the input signal $$\begin{aligned} d2(t') &= incr \text{ if } incr/shift = 1 \\ &= O_{D2SL}(t') \text{ if } incr/shift^* = 1, \end{aligned}$$

where $$\begin{aligned} O_{D2SL} &= q^{(r-1)}_{DF2R} \text{ if } shift = 1 \\ &= q^{(r)}_{DF2R} \text{ if } shift^* = 1. \end{aligned}$$

Bit ring signals br[s] (s = 0, 1, 2, ..., 7) are eight periodic timing signals, each of which is high one cycle out of eight consecutive cycles, and with no two bit ring signals being high at the same time, as shown in FIG. 8. Thus, for example, br[7] = 1 periodically for one clock cycle out of eight consecutive cycles so that the signal $$incr/shift = (ecc\cdot corr)\cdot br[7]\cdot(correct)$$

is high for only one cycle out of eight consecutive cycles.

The input signal corr·we* is fed to the DFR cell in FIG. 4a; and unless the DFR cell is reset or re-initialized by the gen·reset, the output signal ecc·corr* that issues from one output terminal of this DFR cell will be the input signal delayed by one clock cycle, viz $$ecc\cdot corr(t') = corr\cdot we\ (t'-1)^*.$$

Figure 10A:
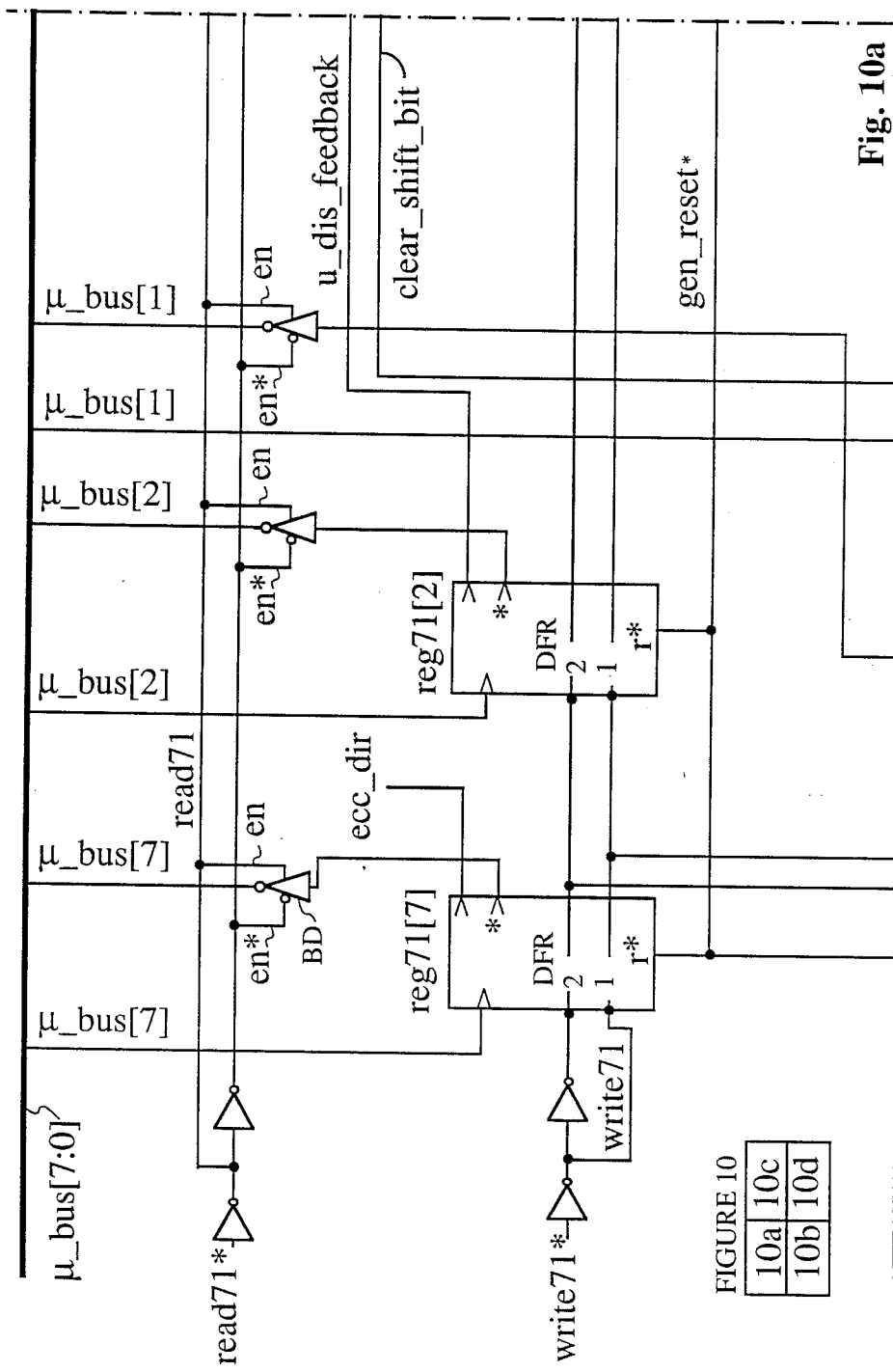
Figure 10C:
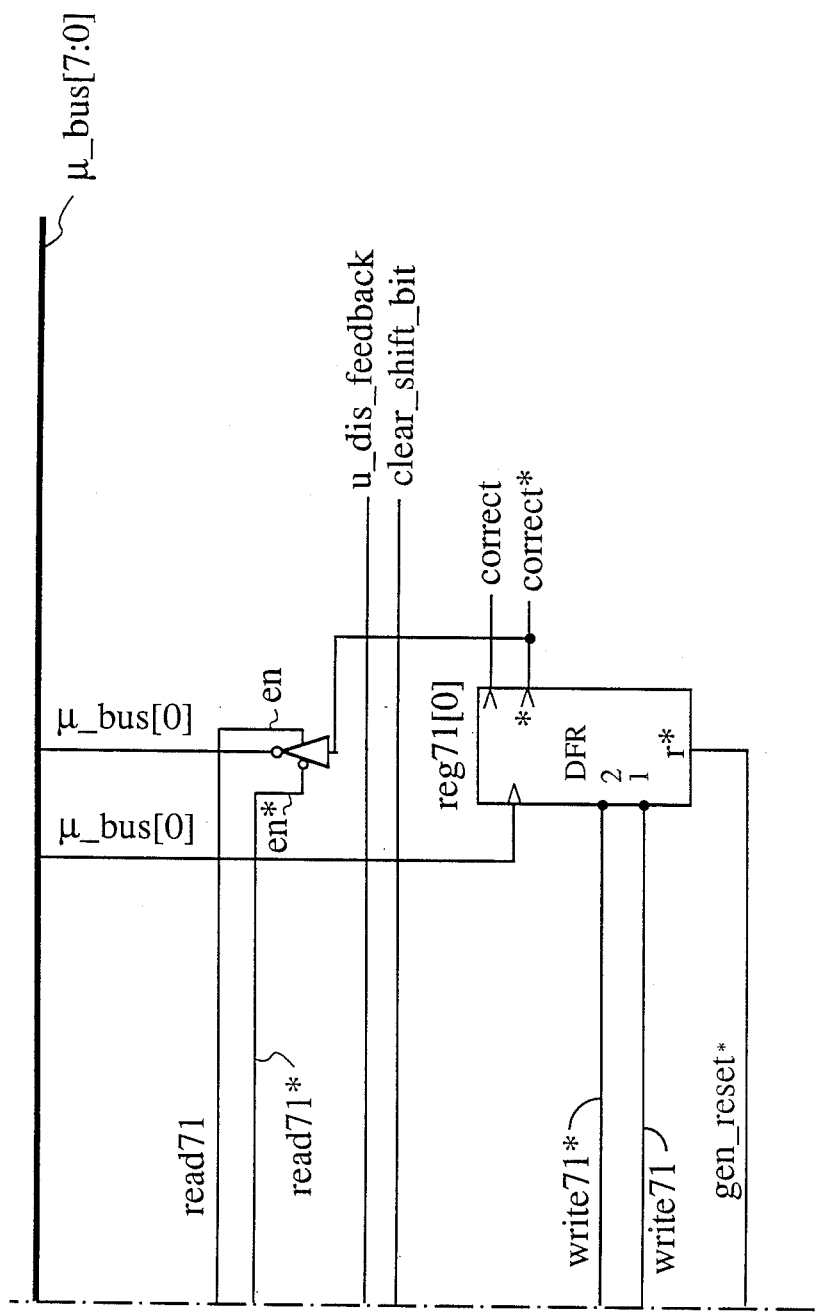
Figure 10D:
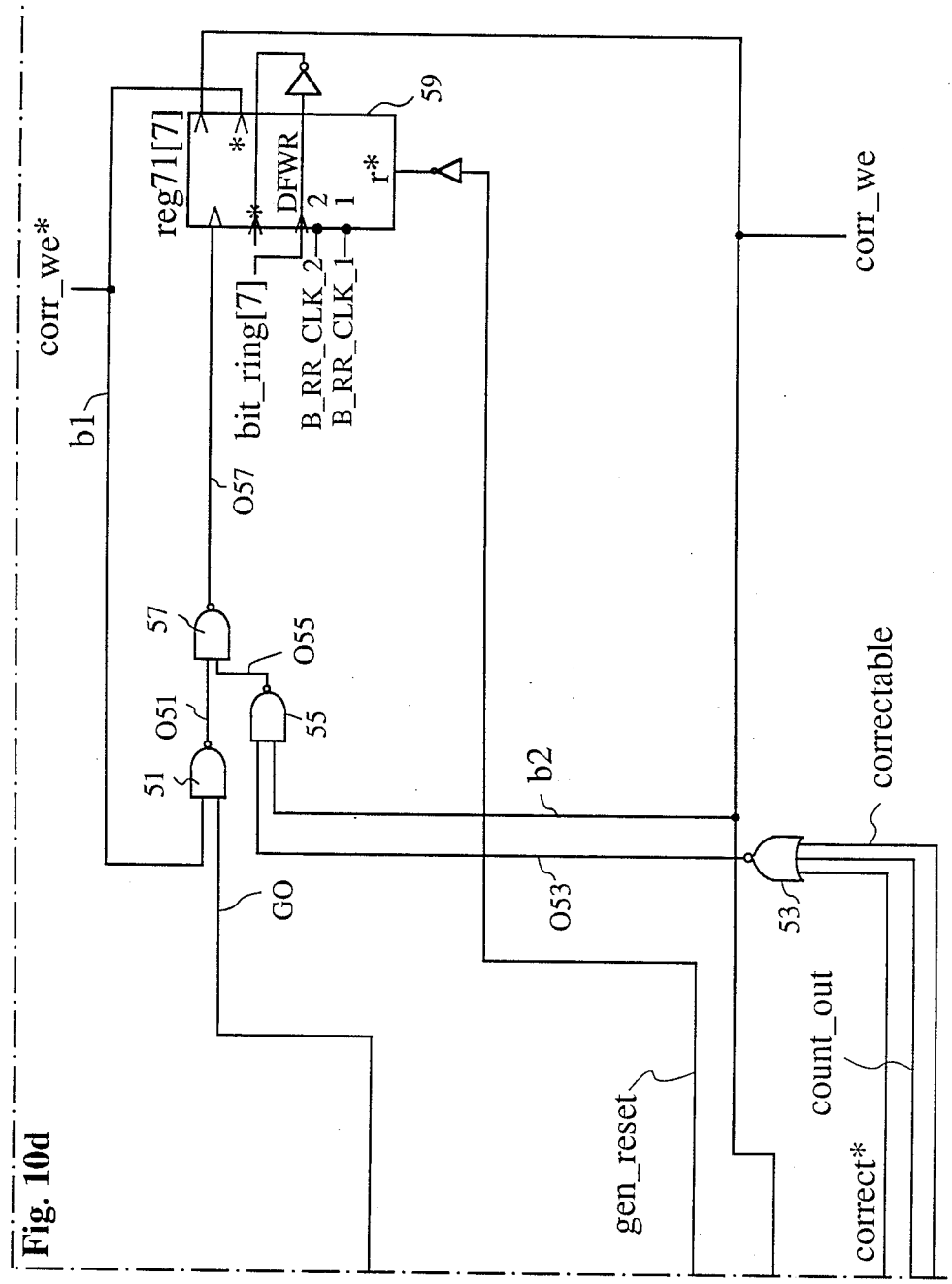

FIGS. 10a–10d, when arranged in the manner illustrated in FIG. 10, illustrate the operation of register $71_H$, whose contents act as flag bits to control the mode of operation of register $72_H$ (as a shift register or as a counter) and of the LFSR and related circuits. Register $71_H$ is an array of eight DFR cells, all driven by the signal write71, which signal functions similarly to the command write72 used in register $72_H$. Similarly, signal read71 and the DFR drivers DFRD in FIGS. 10a–10d act to read out the bit contents REG71$_H$<0-7> in a manner similar to the operation of the signal read72 and the bus drivers BD in FIGS. 4a–4c. The flag bits of register $71_H$ correspond to the following commands.

Bit 0 = 0: reg. $72_H$ shifter mode
Bit 1 = 1: shift REG72$_H$<0-7> into LSBy of LFSR; then clear Bit 1

Bit 0 = 1: reg. $72_H$ counter mode
Bit 1 = 1: clear reg. $72_H$; start correction process; clear Bit 1 if correctable error is found or after contents of LFSR are shifted 256 bytes
Bit 2 = 1: LFSR functions as shift register; feedback is disabled
Bit 3 = 1: don't care (not used here)
Bit 4 : don't care
Bit 5 don't care
Bit 6 : don't care.
Bit 7 = 0: select forward polynomial
Bit 7 = 1: select reverse polynomial.

The output signal $q_0$ of cell DFR$^{(r=o)}$ of register $71_H$ is the signal correct, which is = 1 if register $72_H$ is operating as a counter The q output signals of the other seven DFR cells in register $71_H$ here are:

$q_1$ = ecc·shift·enable,
$q_2$ = $\mu$·fbd,
$q_3$ = don't care,
$q_4$ = don't care,
$q_5$ = don't care,
$q_6$ = don't care,
$q_7$ = ecc·dir.

A high output signal $q_1$ of cell DFR$_{(1)}$ of register $71_H$ enables register $72_H$; this signal $q_1$ is fed to a ser combination of two auxiliary DFRs, denoted ASR in FIG. 10b, that together resolve asynchronous differences between the clock phase $\phi 2$ and the microprocessor write command write71 in FIG. 10b and produce an output signal GO. The signal GO and another (feedback) signal labeled $b_1$ are fed to a two-input NAND gate 51 that produces an output signal O51 = GO* + b1*. Three signals, correct*, count·out and correctable, are fed to a NOR gate 53 and produce an output signal O53 = (correct)·(count·out*)·(correctable*) that is high only if register $72_H$ currently functions as a counter, the binary value of the contents of the eight cells D2I in register $72_H$ is not 0(modulo 256), and the signal "correctable" discussed below is not = 1. The signal O53 and another (feedback) signal b2 are fed to a two-input NAND gate 55 that produces an output signal O55 = O53* + b2*; and the signals O51 and O53 are fed to a two-input NAND gate 57 and produce an output signal O57 = O51 + O55* = GO.b1 + O53.b2. The signal O57 is fed to a one-input DFWR cell 59 that is controlled by the clock gating signals $\phi 1$ and $\phi 2$, by br[7], and by an initialization or reset signal gen reset*. The output signals q and q* of DFWR cell 59 become the signals b2 and b1, respectively.

Figure 9:
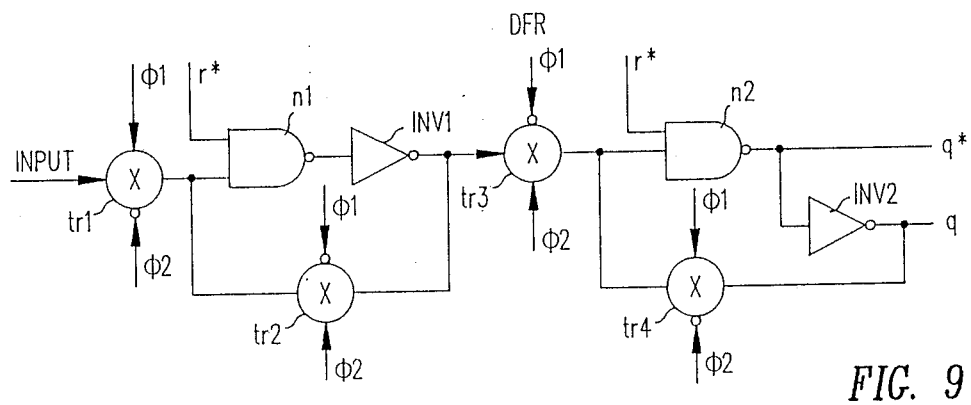
FIG. 9 is a schematic view of a one-input data storage cell DFR used in connection with register $72_H$.
Figure 11:
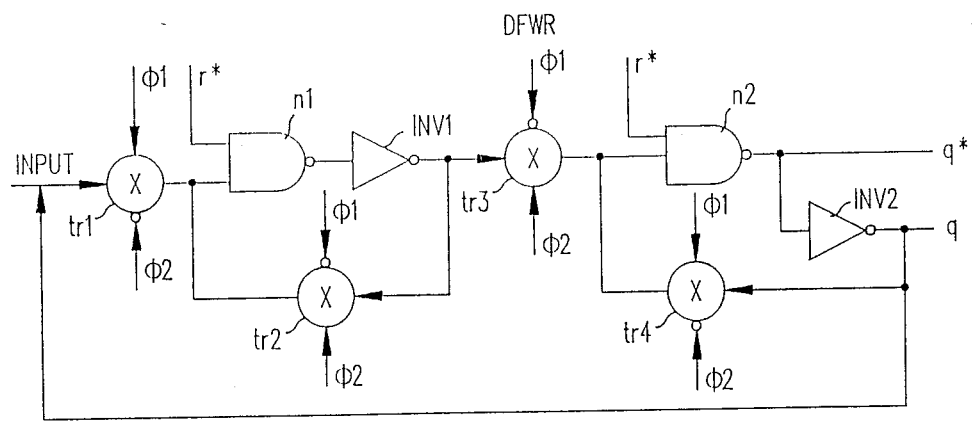
FIG. 11 is a schematic view of a one-input data storage cell DFWR used in connection with register $71_H$ in FIG. 10.

The one-input DFWR cell shown in FIG. 10d, and in greater detail in FIG. 11, is constructed similarly to the DFR cell shown in FIG. 9, except that a feedback line FL is added connecting the output terminal q with the input terminal.

The signal GO produced by the ASR in FIG. 10b is ultimately passed to the DFWR, which then uses feedback to hold the value GO at the output terminal q unless the output signal at this terminal is disturbed by a change in the input signal O53. Signal O51 is used to set corr·we (to 1) if corr·we is not already set, and signal O55 is used to keep corr·we set if corr·we is already set. If any term in signal 53 goes high, corr·we is reset (to 0) on the next high signal of br[7]. The output signal $q_{DFWR}$ = corr·we is then passed to a two-input NOR gate 54, whose other input signal is ecc·corr(t')* = corr·we(t'−1)*, corresponding to a previous clock cycle; the output signal O54 from NOR gate 54 is (ecc·corr)·(corr·we*), which is non-zero only for a single clock interval where corr·we changes state, from high to low, and before ecc·corr changes from low to high.

The output signal O54 together with a gen·reset signal is fed to a two-input NOR gate 56 whose output signal O56 goes low whenever gen·reset=1 or O54=1; the output signal O56 is used as a reset signal r* for bit position r=1 of register $71_H$, which produces a "low" signal at $q_1$ at the end of the shifter phase (correct=0) or at the end of the counter phase (correct=1).

Figure 3A:
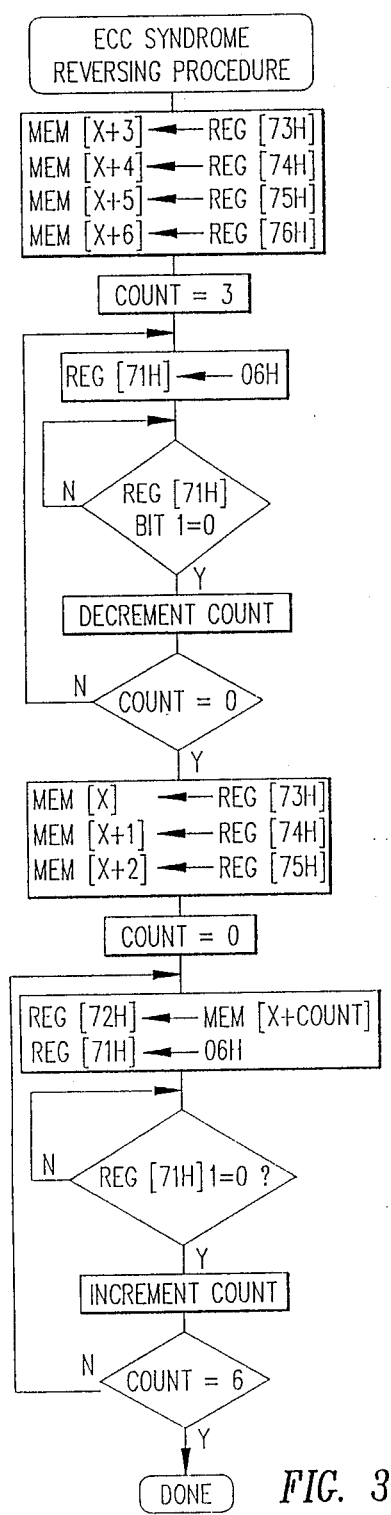
FIGS. 3A, 3B, 3C, 3D and 3E illustrate the logical routine, including various branch points, followed by the apparatus herein in detection and correction of burst mode errors in digital data.
Figure 3B:
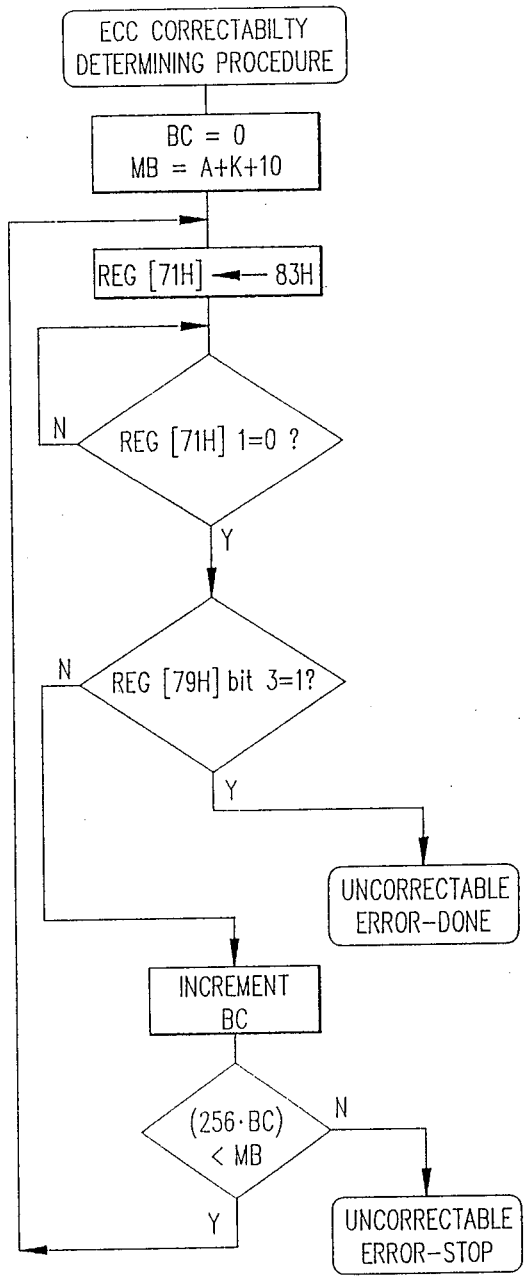
Figure 3C:
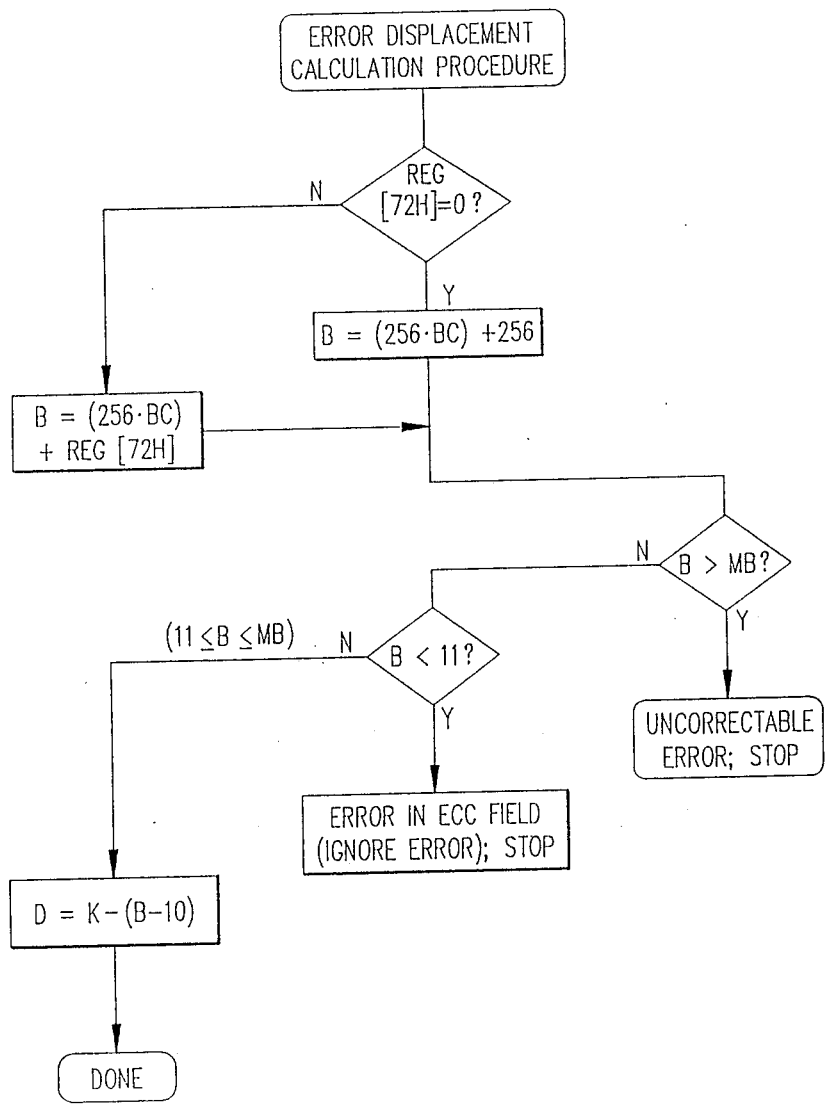
Figure 3D:
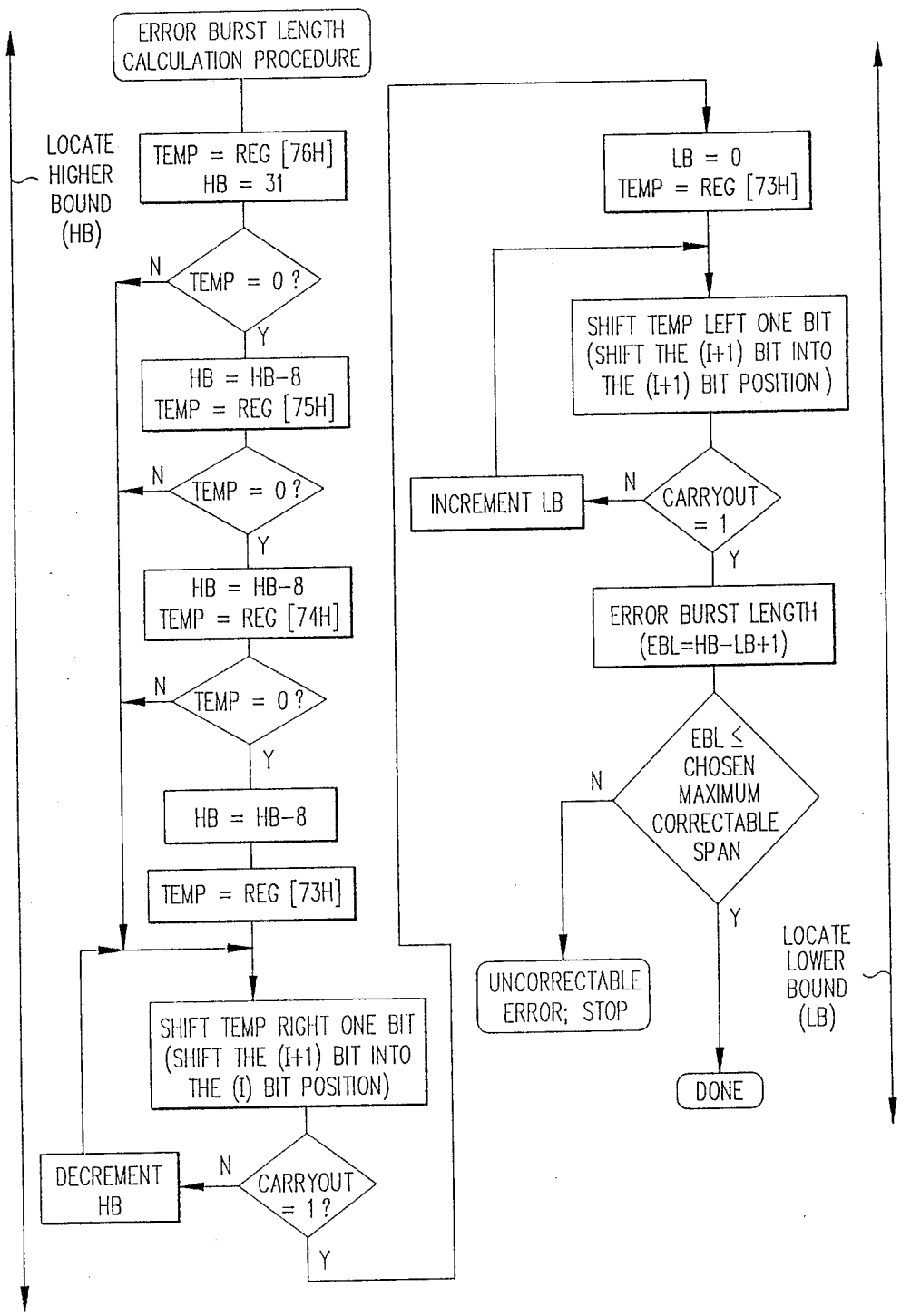
Figure 3E:
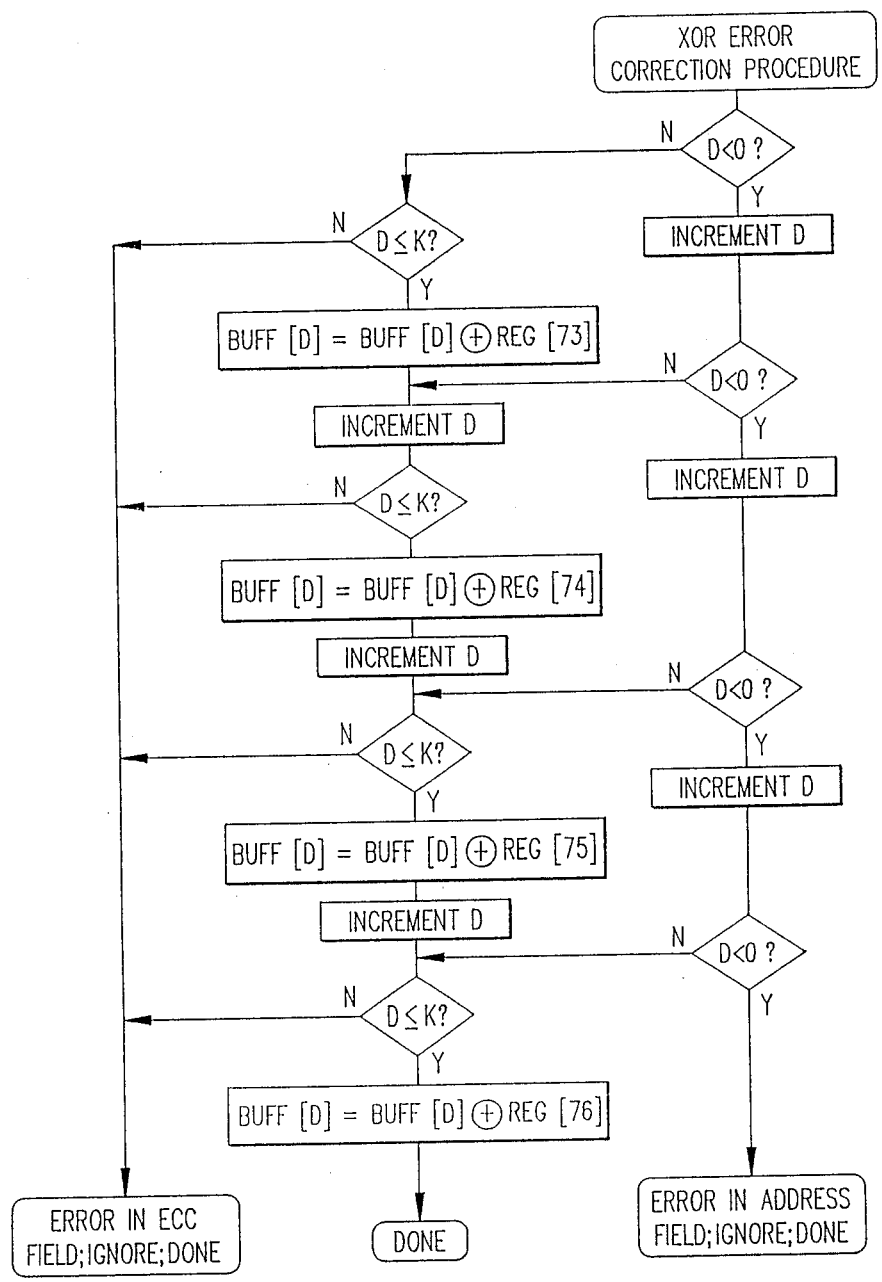
Figure 12:
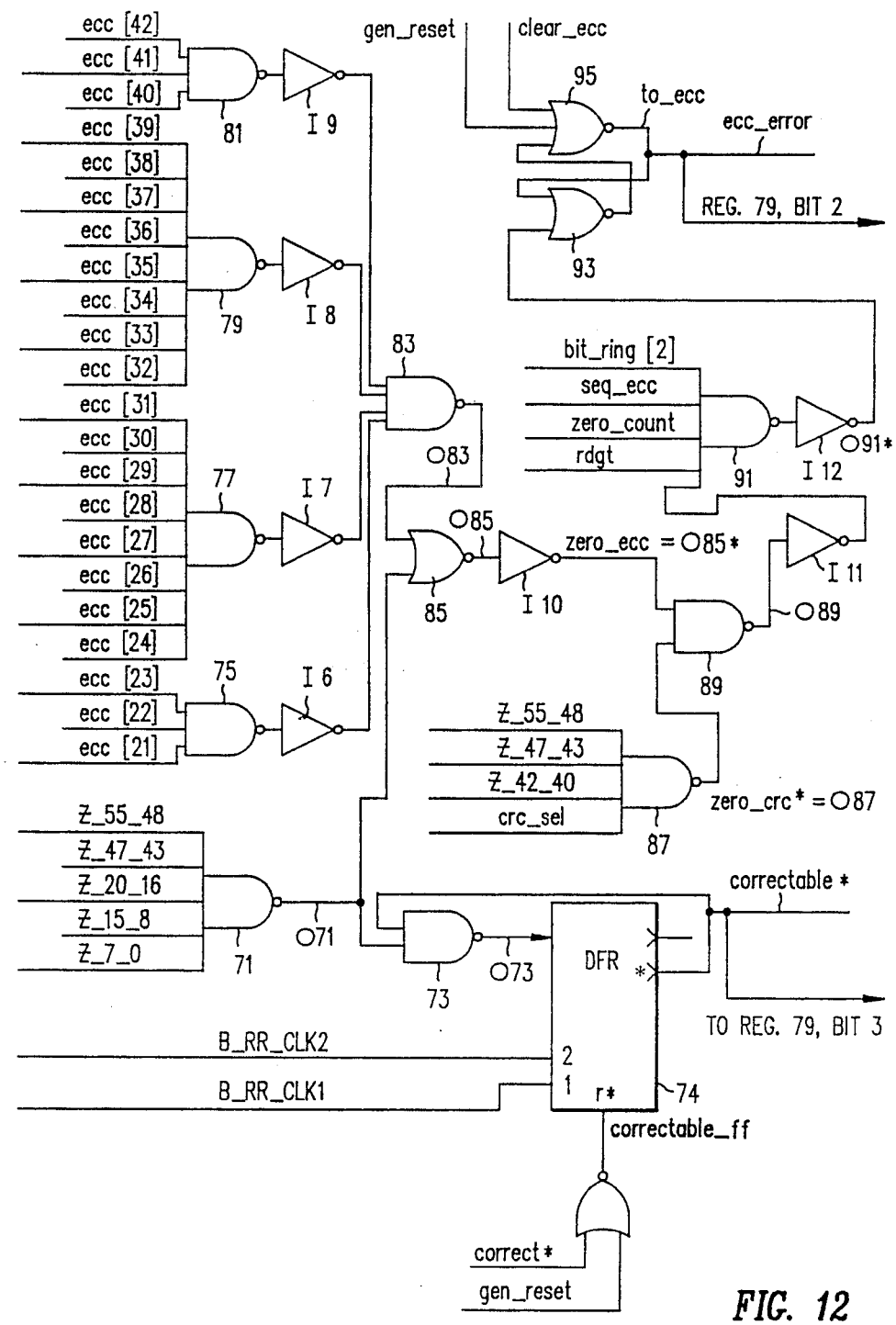
FIG. 12 is a schematic view of the error trap interrogation scheme amd ecc.error signal generator used in one embodiment of the invention.

Following the procedure illustrated in FIGS. 3A and 3B when the contents of the LFSR at this point are the following:

Bits 0-20, all zero,
Bits 21-42, don't care,
Bits 43-55, all zero;

then a correctable error may have been detected and Zcorrect* goes low. Bits 21-42 contain the error terms (max·burst length=22), with bit 21 guaranteed to be non-zero. Correctability of the error is first detected by interrogating the contents of bit positions 0-20 and 43-55, using the five functions Z(0-7), Z(8-15), Z(16-20), Z(43-47) and Z(48-55). The function Z(u-v) is high if and only if the individual bits in positions u, u+1, . . . , v are all zero. These five functions Z(·) are fed to a five-input NAND gate 71, as illustrated in FIG. 12, whose output signal Zcorrect* is low only if each of these five input signals is high. The signal Zcorrect* is fed to a two-input NAND gate 73, whose other input (feedback) signal, denoted correctable*, when low, indicates that the error has already been detected. The signal correctable is set on the next clock event ($\phi 2=1$), and corr·we is reset on the next byte boundary (determined by br[7]=1.) On the next clock event ($\phi 2=1$) ecc·corr and ecc·we are reset; this freezes the error pattern in the LFSR and the error count in register $72_H$, respectively. The output signal O73=Zcorrect*+correctable is high if the syndrome (error) has just been trapped in bit positions 21-42 of the LFSR ($q_j=0$ for bit positions j=0-20 and 43-55 of the LFSR) or if the error has been previously determined to be correctable. The signal O73 is fed to a one-input DFR cell, with clock gating signals $\phi 1$ and $\phi 2$ and a reset signal r*. The output signal, q*=correctable, of this DFR is fed back to NAND gate 73 as noted earlier. When Zcorrect* first goes low, the signal correctable will also be low; O73 will go high, and after one cycle correctable will also be high so that O73 will stay high even if Zcorrect* goes high (i.e., the syndrome is no longer "trapped" in bit positions 21-42 of the LFSR).

The contents q of LFSR bit positions 21-42 are fed to four NAND gates 75 (bits 21-23), 77 (bits 24-31), 79 (bits 32-39) and 81 (bits 40-42), and the output signals of these NAND gates are inverted by four inverters I6, I7, I8 and I9, respectively, to produce four output signals that are fed to a four-input NAND gate 83 whose output signal O83 is given by $$O83 = \left( \prod_{j=21}^{42} (q_j^*) \right)^*,$$

which is the inverted product of the LFSR q* contents of bit positions 21-42. The signal O83 is low only if all $q_j^*$(j=21-42) are high, indicating that the data that has been "trapped" in LFSR bit positions 21-42 is identically zero. The output signals Zcorrect* and O83 are fed to a two-input NOR gate 85 whose output signal zero·ecc=(Zcorrect)·(O83*) is high only if all $q_j$ (j=0 ∝ 55) in the LFSR are zero. The signal zero·ecc is then inverted by an inverter I10 to produce a signal zero·ecc* that is low only if all $q_j$(j=0-55) in the LFSR are zero.

Another output signal O87 is formed by feeding the signal crc·sel and the contents of LFSR bit positions 40-55 to a four-input NAND gate 87 to produce the signal $$zero\cdot crc^* = ((crc\cdot sel)\cdot Z(40\text{-}42)\cdot Z(43\text{-}47)\cdot Z(48\text{-}55))^*$$

The signal zero·crc* is low if division by $P_{crc}$ has been selected and Z(40-42), Z(43-47) and Z(48-55) are all high, indicating that division in the LFSR by $P_{crc}$ is enabled and all $q_j$ (j=40-55) in the LFSR are all zero. The signals zero·ecc* and zero·crc* are then fed to a two-input NAND gate 89 whose output O89 is high if either zero·ecc=1 (all $q_j=0$ in the LFSR) occurs or if crc is selected and zero·crc=0 ($q_j=0$ for j=40-55) occurs. The output signal O89 of gate 89 is inverted by an inverter I11 and fed to one input of a five-input NAND gate, 91, whose other input signals are br[2], seq·ecc, zero·count and rdg. The output signal O91 is inverted by inverter I12 to produce an output signal O91*=O89*·rdg·(zero·count)·(seq·ecc)·br[2] that is high at the end of a decode operation, defined by rdg=zero·count=seq·ecc=br[2]=1, only if the appropriate zero syndrome was not found and an ecc error (or crc error) was detected. The signal O91* together with a feedback signal f is fed to a two-input NOR gate 93 that produces an output signal O93=O91·f* that is fed to a three-input NOR gate 95. The other two input signals fed to gate 95 are clear·ecc and gen·reset so that the output signal from gate 95 is O95=ecc·error=(-f+O91*)·(clear·ecc*)·(gen·reset)*; this output signal is high if an error is detected, using divisor polynomial P or $P_{crc}$. The tandem NOR gate arrangement of 93 and 95 with feedback in FIG. 12 is an example of the tandem NOR gate arrangement with feedback shown in FIG. 13, which operates as an RS latch according to Table 4, where the input signals are labeled R (reset) and S (set). Note that for R=S=1 the system is unstable; the system will stabilize as either R or S goes to 0.

TABLE 4

| R | S | q | q* |
|---|---|---|----|
| 0 | 0 | q | q* |
| 0 | 1 | 1 | 0 |
| 1 | 0 | 0 | 1 |
| 1 | 1 | 0 | 0 (unstable) |

Figure 13:
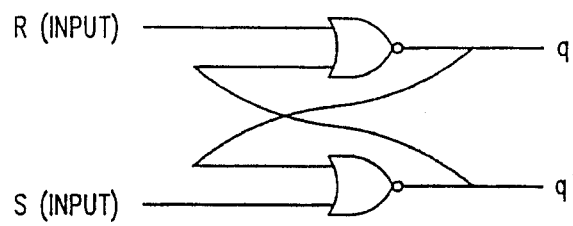
FIG. 13 is a schematic view of a latch, formed from a tandem arrangement with feedback of two NOR gates.

FIG. 13 is a schematic view of a latch, formed from a tandem arrangement with feedback of two NOR gates. The output of the latch in FIG. 13 that is driven by the inputs R and S as shown will be called the latch product of R and S. Here the signal ecc·error is the latch product of R=clear·ecc+gen·reset and S=O91*.

Figure 14:
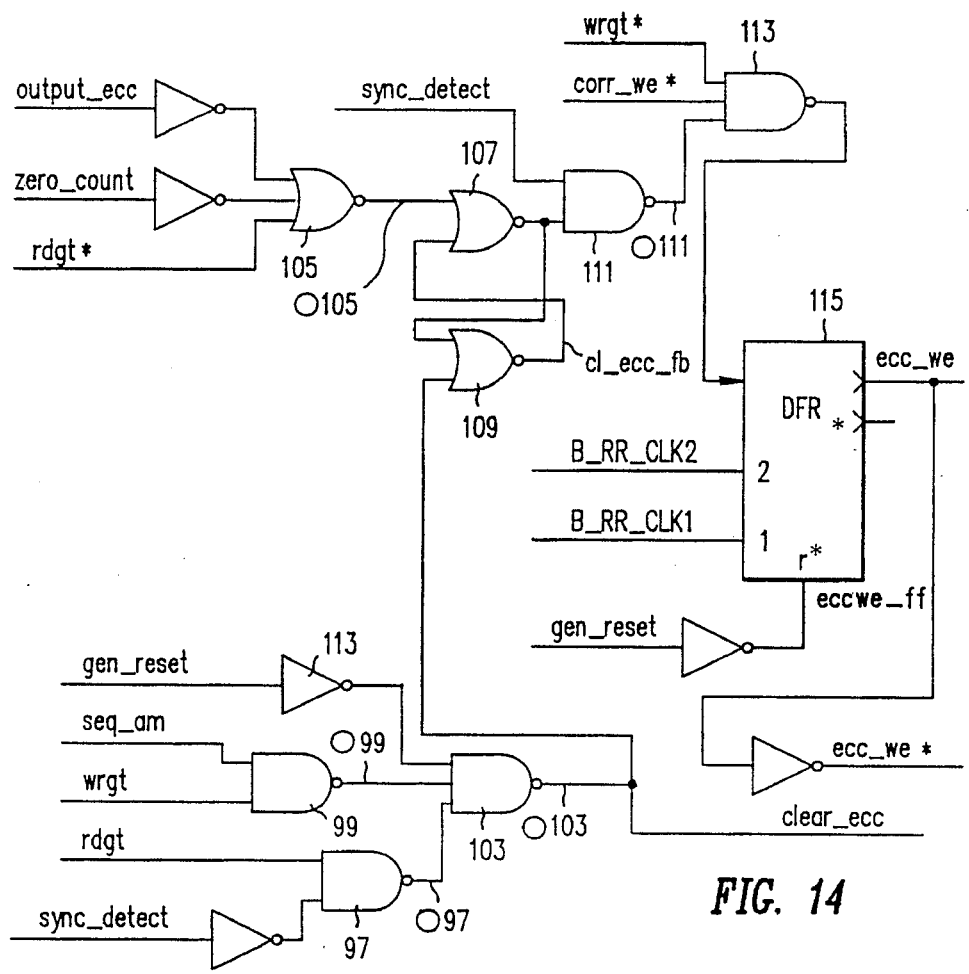
FIG. 14 is a schematic view of apparatus used generate the ecc.we signal used in the LFSR in FIGS. 1a–1i.

A signal sync·detect is generated when the initial portion of an augmented data stream is detected; this signal is passed through a delay cell DF as shown in FIG. 12, and the output signal is a time delayed signal sync·detect·late. With reference to FIG. 14, the signals sync·detect·late* and rdg are fed to a two-input NAND gate 97; and the signals wrg and seq·am are fed to a two-input NAND gate 99. The output signal O99 of NAND·gate 97 is low only if the system is in the decode mode (rdg=1) and the initial portion of an augmented data stream has not (yet) arrived. The output signal O99 of NAND gate 99 is low only if the system is in the encode mode (wrg=1) and the sequencer timing signal seq·am, which aids in initializing the LFSR in the encode mode, is high. The output signals O97 and O99 are low at the beginning of the decode and encode mode, respectively. The output signals of these two NAND gates plus the signal gen·reset* are fed to a three-input NAND gate 103, whose output signal O103 is high if the LFSR is to be initialized (set). The O103 signal is buffered to produce the clear·ecc signal.

The signals out·ecc*, zero·count* and rdg* are fed to a NOR gate 105 whose output (out·ecc) ·(zero·count)·(rdg) is high at the end of the decode mode. The output signal O105 is fed to one input of a two-input NOR gate 107 that is a component of a tandem arrangement of NOR gates 107 and 109 that comprise an RS latch as discussed above. The latch component 109 receives the output signal O103 at one of its two inputs. The latch product or output signal O107 is (1) unchanged if O103=O105=0, (2) high if O105*=O103=1, and (3) low if O105=O103*=1.

The output signal O107 and the signal sync·detect·late are fed to a two-input NAND gate 111; and the output signal O111 plus the signals wrg* and corr·we* are fed to a three-input NAND gate 113 to produce an output signal O113. The signal O113 is fed to a DFR (delay) cell 115 that is driven by the clock phases $\phi 1$ and $\phi 2$ and by the reset signal gen·reset*; the q terminal output signal of DRF cell 115 is ecc·we. The signal ecc·we=1 allows the LFSR to change state. In the correction mode, ecc·we follows the signal corr·we, delayed by one clock event, through NAND gate 113 and DFR cell 115. In the encode mode, ecc·we follows wrg, delayed by one clock event. In the decode mode, ecc·we is enabled by NAND gate 111, passed through NAND gate 113 and DFR cell 115. Gate 111 will enable gate 113 only if sync·detect·late is high and the decode mode RS latch, consisting of NOR gates 107 and 109 with feedback, is set. The decode mode RS latch will be set by a clear·ecc signal and will be reset at the end of the message to be decoded. The end of the message can be determined by the requirement that zero·count=rdg=out·ecc=1.

Figure 15:
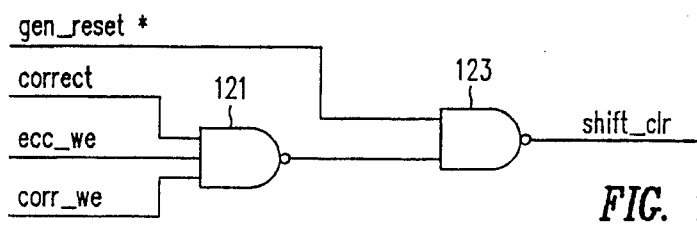
FIG. 15 is a schematic view of apparatus used to generate the shift clear signal in register $72_H$ in FIGS. 4a, 4b and 4c.

The control signal shift·clear used to reset the DF2R data storage cells in FIGS. 4a–4c is generated by the arrangement shown in FIG. 15. Three input signals, correct, ecc·we and corr·we are fed to a three-input NAND gate 121, and the output signal from this gate is fed to a two-input NAND gate 123, together with the input signal gen·reset*. The output signal from NAND gate 123,

*shift·clear=correct·(ecc·we)·(corr·we)+gen·reset,* is high if gen·reset goes high or if the system is in the correction mode and register $72_H$ is to function as a counter beginning with the present clock event (ecc·we=1).

For ease of reference, many of the "titled" signals are collected here, their functions are indicated, and the mode or modes in which each signal is used is indicated; here (c), (d) and (e) denote correction mode, decode mode and encode mode, respectively.

| | | |
|---|---|---|
| ADS (d,c) | = | augmented data stream = message (k bits) + syndrome (n-k bits) |
| br[7] (c,d,e) | = | one of eight consecutive counts or clock cycles; aids in byte counting in register $72_H$ |
| crc·fb (d,e) | = | (crc·sel)·(enfb)·(fbactive) |
| crc·sel (d,e) | = | selects $P_{crc}$ for polynomial division in LFSR |
| d·ecc·$\phi$ (c,d,e) | = | (correct*) sh[7] + (enfb)·(fbactive); data stream for LFSR |
| ecc·error (d) | = | 1 if an error is found in signal |
| enfb (c,d,e) | = | 0 only during augmentation phase of encode mode, when wrg = out·ecc = 1, or during syndrome capture/reversal phase at correction node, when wrg* = rdg* = $\mu$·fbd = 1. |
| fbactive (c,d,e) | = | $q_{55}\oplus$ ((ecc·corr)* · (serial data)) |
| out·ecc (d,e) | = | format sequencer timing signal; in encode mode, disables operation of feedback to LFSR and operation of polynomial division; switches input to data output portion of network (from original message u to remainder r for augmentation) |
| $q_{55}$ | = | MSB of LFSR |
| seq·am (e) | = | format sequencer timing signal that aids in initializing ecc in encode mode |
| wrg (e) | = | write gate (= 1 only in encode mode) |
| rdg (d) | = | read gate (= 1 only in decode mode) |
| seq·ecc (d) | = | format sequencer timing signal; used to terminate calculations in decode mode |
| sync·detect (d) | = | indicates when first portion of augmented data stream has arrived |
| sync·detect·late (d) | = | delayed sync·detect signal |
| zero·count (d, e) | = | format sequencer timing signal; aids in decoding end of mode |
| cin (c) | = | cin (register r) = cout (reg. r-1); cin (reg 0) = correct |
| cout (c) | = | cin·$q_{DF2R}$; binary carry out signal for sum cin + $q_{DF2R}$ |
| clear·ecc (d, e) | = | sets the LFSR contents to ones for initialization. |
| correct (c) | = | REG71$_H$<0> = 1 (= 0) if reg. $72_H$ is to function as a counter (as a shift register) |
| correctable (c) | = | 1 if error trap condition for bits 0–20 and 43–55 is met |
| count·out (c) | = | 1 only when D2I binary count in reg. $72_H$ reaches 256 (= 0 mod 256) |
| corr·we (c) | = | input to DFR of reg. $72_H$ and to ecc·we; enables correction/shift phases; corr·we = 1 in correction mode but goes low at the end of the count phase or the shift phase corr·we(t'-1) = ecc·corr(t') |
| ecc·corr (c) | = | ecc·corr(t') = corr·we(t'-1) |
| ecc·dir (c) | = | REG71$_H$<7> = 0 (= 1) if division by P (by $P_r$) is selected |
| ecc·shift·enable (c) | = | REG71$_H$<1> = 1 if a 256-byte shift/correction attempt is being made; = 0 if circuit is to remain idle |
| ecc·we (c,d,e) | = | 1 when the LFSR is allowed to change state |
| $\mu$·fbd (c) | = | REG71$_H$<2>; disables feedback signal and polynomial division in LFSR if $\mu$·fbd = 1 |
| incr (c) | = | $q_{DF2R}\oplus$ cin; binary sum with carry |
| incr/shift (c) | = | (ecc·corr)·br[7]·(correct); multiplexes output of incr (D2I) and shifter (D2SL) cells to the DF2R cell in reg. $72_H$ |
| i1$_{D2I}$, i2$_{D2I}$ | = | i1D2I = i2$_{D2I}$· = $q_{DF2R}$ |
| ic$^{(r)}$ (c) | = | $q_{DF2R}$ of reg. r; input to D2SL of reg. $72_H$ |
| ip$^{(r)}$ (c) | = | $q_{DF2R}$ of reg. r-1; input to D2SL of reg. $72_H$ |
| REG71$_H$<0> (c) | = | correct |
| REG71$_H$<1> (c) | = | ecc·shift·enable |
| REG71$_H$<2> (c) | = | $\mu$·fbd |
| REG71$_H$<7> (c) | = | ecc·dir |
| read72$_H$ (c) | = | output contents of DF2R in reg. $72_H$ to UBUS, if high |

| | -continued |
|---|---|
| write72$_H$ (c) | = write contents of UBUS into LT of reg. 72$_H$, if high |
| shift (c) | = (ecc·corr)·(correct*) |
| | = 1 (= 0) if the output from D2SL is to be ip (ic); high only during noncounting phase of correction mode |
| shift·clear (c) | = 1 only at beginning of count in reg. 72$_H$ counting phase or when gen·reset goes high |
| sh[7] (c) | = MSB of q$_{DF2R}$ in reg. 72$_H$ |
| load* (c) | = (ecc·corr*)·(correct*); when load* = 0, the contents of the LT are loaded into the DF2R in reg. 72$_H$ |
| Zcorrect (c) | = Z(0–7)·Z(8–15)·Z(16–20)·Z(43–47) Z(48–55) |
| zero·crc (c) | = 1 if CRC option is enabled and LFSR bits 40–55 are all low |
| zero·ecc (c) | = 1 if all LFSR bits are low |
| $\phi$1, $\phi$2 (c,d,e) | clock phases; $\phi$2 = $\phi$1*; one clock cycle consists of two consecutive phases (low-high or high-low) |

The names of signals used here are not relevant to the invention but have been chosen as mnemonic tags to indicate the functions of those signals. As noted above, the eight-bit register 72$_H$ may be replaced by a q-bit register, with minimum and maximum binary count in the collection of D2I cells of 0 and $2^q-1$, respectively; in this instance, register 72$_H$ would shift q bits, rather than eight bits, into the LFSR upon command. The LFSR itself has been demonstrated with 56=8·7 bit positions. However, the LFSR could as well have M bit positions where M is divisible by q. For example, if the LFSR has length 32 bits, 40 bits, 48 bits or 56 bits, the maximum correctable burst length error appears to be 11, 14, 18 or 22, respectively.

Figure 16A:
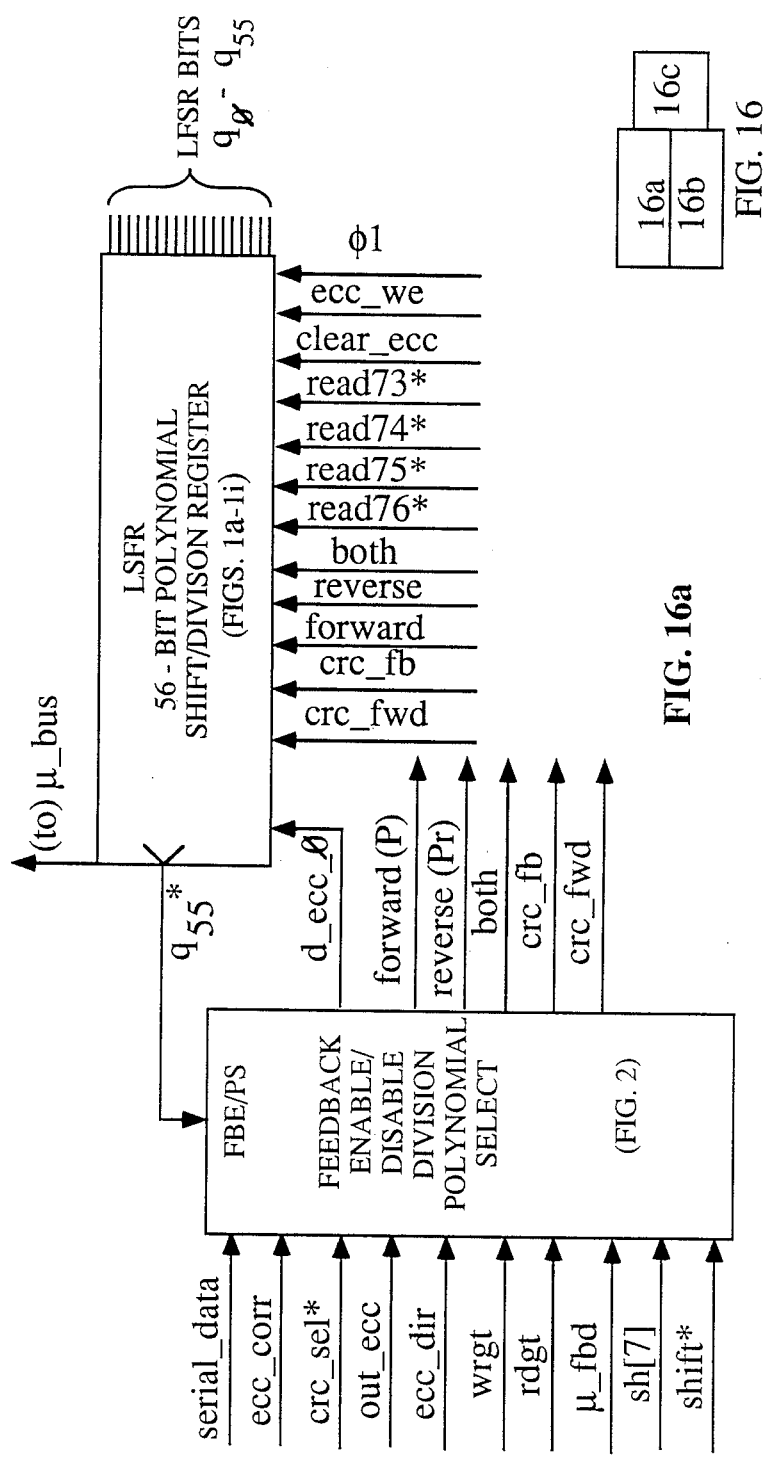
FIGS. 16a–16c, when arranged as illustrated in FIG. 16, comprise a block diagram, showing all input and output signals, of six functional blocks that comprise one embodiment of the invention. Included within parentheses in each of the blocks is the figure number, or numbers, denoting where the detail of the circuitry included with the block is illustrated.
Figure 16B:
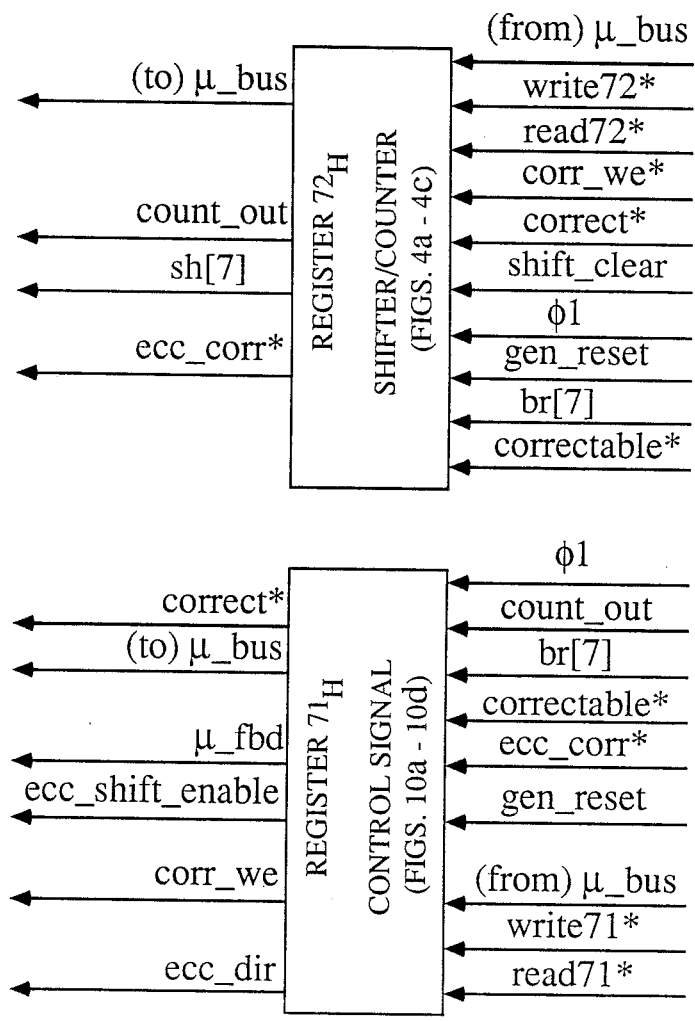
Figure 16C:
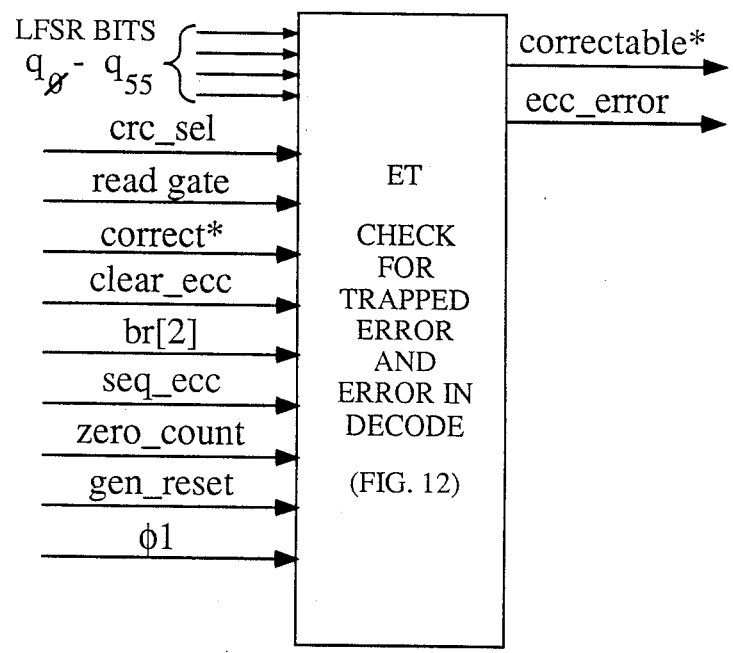
Figure 16C:
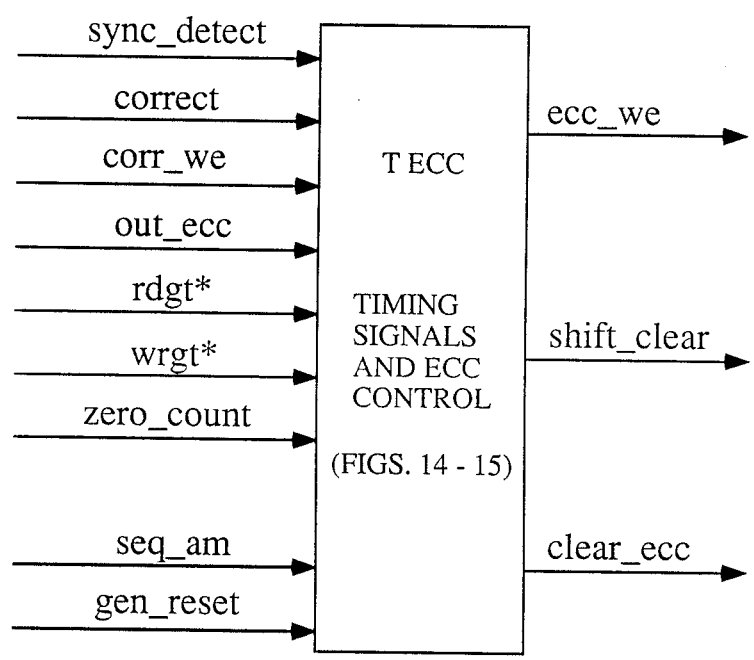

FIGS. 16a–16c present an overview of the major functions of the error detection correction system, as an assembly of functional blocks with the input signals and output signals as shown. Most of the connections between the blocks are not shown here, to avoid a confusion of lines. Where a signal h and its binary complement h* both serve as input signals to a block (or as output signals from a block), only one of these two signals is shown, both to minimize the number of input lines shown and to indicate that only one such input signal need be provided, with the binary complement of such signal being generated internally by use of an inverter; this is true for all blocks and circuits.

The feedback enable/polynomial select block FBE/PS receives the serial data plus q$_{55}$* from the LFSR plus input signals indicating: (1) in which mode (encode, decode or correction) the system currently operates; (2) if the correction mode is currently operative, whether register 72$_H$ currently operates as a shift register or as a counter; (3) which of the three division polynomials P or P$_r$ or P$_{crc}$ is currently used for division in the LFSR; and (4) whether feedback to the LFSR is currently disabled (encode and correction modes only).

The FBE/PS block produces output signals that: (1) control division by the polynomial P or P$_r$ or P$_{crc}$ within the LFSR; and (2) provide the data input stream (d·ecc·$\phi$) for the LFSR at bit position 0 and at bit position 40 (if P$_{crc}$ is active).

The LFSR receives the data input stream d·ecc·$\phi$ from the FBE/PS block plus input signals indicating: (1) which divisor polynomial, if any, is currently operative within the LFSR; (2) whether the system is currently in the correction mode; (3) whether the bit contents of the LFSR should be cleared and whether the status of the LFSR should be changed; (4) the clock phase signal; and (5) whether one or more of four eight-bit registers should be read for storage in a RAM for subsequent processing.

The LFSR generates output signal q$_{55}$* that represents the incoming data stream d·ecc·$\phi$ after repeated division by the chosen divisor polynomial P or P$_r$ or P$_{crc}$, if any, which is fed back as an output signal to the FBE/PS block. The LFSR bit contents q$_o$–q$_{55}$ are sent to the ET block for error trapping examination by the block ET.

The ET block receives the bit contents q$_o$–q$_{55}$ from the LFSR plus input signals indicating: (1) whether the initial portion of the incoming data stream has just arrived (sync·detect); (2) whether the CRC polynomial is currently selected for division within the LFSR; (3) whether register 72$_H$ currently operates as a counter in the correction mode; (4) whether the bit contents of the LFSR should be cleared and (5) the clock phase signal and certain other timing information.

The ET block produces output signals: (1) indicating whether the error trap condition (bits q$_o$–q$_{20}$ and q$_{43}$–q$_{55}$ all zero in the LFSR) is met so that the message error, if any, may be correctable; and (2) whether an error has been detected in the received message h.

The TECCC block provides as output timing signals and ecc control signals $\phi$1 (clock), shift·clear and ecc·we, using certain timing signals plus input signals indicating: (1) whether the initial portion of an incoming data stream has just arrived; (2) whether the system is in the correction mode, and if so whether register 72$_H$ currently operates as a counter; (3) whether feedback to the LFSR is currently disabled (encode mode only); and (4) whether initialization is being or has been performed in the decode mode.

Register 71$_H$ receives input signals indicating: (1) whether selected current bit contents of register 71$_H$ should be transmitted on a $\mu$bus line; (2) whether the contents of a bus line should be written into register 71$_H$; (3) whether the message error may be correctable; (4) whether register 72$_H$, used as a counter, has reached its maximum count (255 or $2^q-1$); and (5) the clock phase signal. Register 71$_H$ provides output signals indicating: (1) that the system is currently in the correction mode, and if so whether register 72$_H$ currently operates as a counter; (2) whether LFSR feedback is currently disabled (correction mode); and (3) which division polynomial P or P$_r$, if either, should be currently used in the LFSR.

Register 72$_H$ performs data read, data write, data shifting and counting operations. Register 72$_H$ receives input signals indicating: (1) whether the current bit contents of register 72$_H$ should be transmitted on a $\mu$bus line; (2) whether the contents of a $\mu$bus line should be written into register 72$_H$; (3) whether register 72$_H$ should operate as a counter; (4) whether the system is currently in the correction mode; (5) whether register 72$_H$ should be reset; (6) whether a byte boundary is present; and (7) the clock phase signal.

The foregoing presentation has used logical zeroes and logical ones (i.e., voltage signals whose values are treated as having the respective values 0 and 1 for purposes of binary operations such as addition and multiplication and formation of exclusive or sums). It should be understood that the voltage values associated with a logical zero and a logical one are not necessarily substantially zero and positive, respectively. Using ECL logic, for example, a logical zero and a logical one may correspond, respectively, to the voltages −1.8 volts and −0.9 volts. Further, the data and control signals may be replaced by their binary complements, with the necessary changes being made in the NAND, NOR and inverter gates, and the network would work conceptually as before. Further, the left shift cells D2SL shown in FIGS. 4a, 4b, 4c and 6 may be replaced by right shift cells, with the necessary changes being made in output terminal connections in FIGS. 4a, 4b, 4c and the network would work as well. Further, although the assembly counting cells D2I in FIGS. 4a–4c are arranged there to behave as an incrementer ($n = n_{initial} \rightarrow n_i + 1 \rightarrow n_i + 2 \rightarrow \ldots \rightarrow n_{limit}$), this subsystem will also work as a decrementer ($n = n_i \rightarrow n_i - 1 \rightarrow n_i - 2 \rightarrow \ldots \rightarrow n_{limit}$).

Certain signals used by these modules are not generated within this system but are generated "externally" by another part of the microprocessor system that is not otherwise involved in the error detection and correction process. These "external" signals include the timing signals br[s] (s=0,1,2, ... ,7 or q−1), seq.am, seq.ecc, zero.count, sync.detect, control signals out.ecc, crc.sel, rdg, wrg, read71, write71, read72, write72 and gen.reset, and the data streams serial data and μbus (0,1,2, ... ,7 or q−1).

The invention described herein offers the following improvements:

1. Register $72_H$, the data register, functions as a byte shifter in one phase of the correction mode and as a counter in another phase of the correction mode;

2. Error trapping occurs in the middle of a 56-bit error pattern, rather than occurring at the end, so that zero time delay for stopping is not required; this allows use of a higher bit rate, here up to 24 MHz;

3. A byte-shifting (rather than bit-shifting) mechanism is used here for a serial processor, using the signals br[7] and incr/shift for control; the incremental unit is a byte, not a bit;

4. Error alignment is automatic at completion of the syndrome capture/reversal phase of the error correction mode;

5. Bit reversal for the syndrome reversal process is automatic;

6. Use of four-byte read capability allows the entire error pattern to be read in one segment for maximum burst length (22 or other burst length number appropriate to the number n−k); and 7. Time required for error correction is reduced by a factor of about 2,000.

We claim:

1. In a network for detecting digital signal errors, the network including an M-bit linear feedback shift register for digital signal encoding and decoding and error pattern definition by division of a digital signal by one of a plurality of predetermined error check polynomials, an improvement wherein the network includes a q-bit data register, directly or indirectly connected to said linear feedback shift register, that can load data from q parallel data lines into said q-bit data register, can read data to q parallel data lines from said q-bit data register, can shift data from said q-bit data register to said linear feedback shift register, and can operate as a counter, which in response to a predetermined limit count controls the process of an error pattern computation phase of a correction mode, said q-bit data register having q substantially identical processors numbered r=0,1,...,q-1, with processor no. r comprising:

a latch cell having a first data input terminal, a first control input terminal and a first data output terminal to receive, as a first data input signal at said first data input terminal, one bit of q consecutive bits of data from a data line and to hold that bit for issue as a first data output signal at said first data output terminal, to receive a first control signal at said first control input terminal, and in response to receipt of a first control input signal of a first predetermined voltage value, to transmit said first data input signal as said first data output signal, and, in response to receipt of the binary compliment of said predetermined first voltage value, to transmit said previously-received first data input signal to said first data output terminal;

a multiplexer having second and third data input terminals, a second control input terminal and a second data output terminal, to receive at said second data input terminal a second data input signal that is a fifth data output signal from processor no. r, to receive at said third data input terminal a third data input signal that is a fourth data output signal from processor no. r, to receive at said second control input terminal a second control input signal that determines whether said second data input signal or said third data input signal shall be transmitted by said multiplexer to said second data output terminal, and to transmit to said second data output terminal a second data output signal that is said second data input signal or said third data input signal, as determined by said second control input signal;

a data storage cell having fourth and fifth data input terminals, a third control input terminal, a clock phase input terminal and a third data output terminal, to receive at said fourth data input terminal a fourth data input signal that is said first data output signal from processor no. r, to receive at said fifth data input terminal a fifth data input signal that is said second output signal from processor no. r, to receive at said third control input terminal a third control input signal that determines whether said fourth data input signal or said fifth data input signal shall be stored at said third data output terminal for subsequent transmittal as a third data output signal by said storage cell, to receive at said clock phase input terminal a substantially periodic clock phase input signal that changes phase at least twice during each clock cycle and determines when the signal held at said third data output terminal shall be transmitted, and to transmit to said third data output terminal as a third data output signal, the signal that appears at said third data output terminal, at a time determined by said clock phase input signal;

a data shift cell having sixth and seventh data input terminals, a fourth control input terminal and a fourth data output terminal, to receive at said sixth data input terminal a sixth data input signal that is said third data output signal from processor no. r, to receive at said seventh data input terminal of processor unit number r (r=1,2, ... q−1) a seventh data input signal that is said third data output signal from processor no. r−1, to receive at said fourth control input terminal a fourth control signal that determines whether said sixth data input signal or said seventh data input signal shall be transmitted by said data shift cell, and to transmit a fourth data output signal that is said sixth data input signal or said seventh data input signal, as determined by said fourth control input signal;

a counter cell having eighth and ninth data input terminals and fifth and sixth data output terminals, to receive at said eighth data input terminal an eighth data input signal that is said sixth data output signal of processor no. $r-1$ ($r=1,2,\ldots q-1$), to receive at said ninth data input terminal a ninth data input signal that is said third data output signal to processor no. r, to transmit at said fifth data output terminal a fifth data output signal that is the binary sum without carry, of said eighth and ninth data input signals, and to transmit at said sixth data output terminal a sixth data output signal that is the carry bit of the binary sum of said eighth and ninth data input signals; and a drive cell having having a tenth data input terminal, a fifth control input terminal and a seventh data output terminal, to receive at said tenth data input terminal as a tenth data input signal said third data output signal from processor no. r, to receive a fifth control input signal at said fifth control input terminal, and to transmit said third data output signal as a seventh data output signal at said seventh data output terminal in response to receipt of a fifth control input signal having a voltage equal to a second predetermined voltage value at said fifth control input terminal, where said seventh data input signal of processor unit number $r=0$ is held at a third predetermined, substantially constant voltage, and said eighth data input signal of processor no. $r=0$ has a fourth predetermined voltage value if said q-bit data register is operating as a counter and has a different voltage value if said q-bit data register is not operating as a counter, and where said integer M is divisible by the integer q.

2. A network according to claim 1 in which said data storage cell in each of said q substantially identical processors that comprise said data register further comprises an initialization input terminal to receive an initialization input signal that resets, to a predetermined voltage value, the voltage at said third data output terminal, irrespective of the present voltage at the third data output terminal, when the voltage of said initialization input signal is equal to a sixth predetermined voltage value.

3. The improvement according to claim 1, wherein said number M of bit positions in said linear feedback shift register is a number divisible by eight.

4. The improvement according to claim 3, wherein said number of bit positions q in said data register is a number divisible by eight.

5. The improvement according to claim 1, wherein when said q-bit data register is operating as a counter, said initial count ni and said limit count nf of said counter satisfy the relation $ni < nf$ and said counter increments a count from said initial count ni toward said limit count nf.

6. The improvement according to claim 1, wherein when said q-bit data register is operating as a counter, said initial count ni and said limit count nf of said counter satisfy the relation $ni > nf$ and said counter decrements a count from said initial count ni toward said limit count nf.

7. The improvement according to claim 1, wherein said network operates in said error pattern computation phase of said correction mode, after a digital signal error has been detected and while said network is attempting to identify this error, and operates in at least one other phase of said correction mode, where said network generates a sixth control input signal with a voltage value equal to a fifth predetermined voltage value if and only if said network is in said error pattern computation phase of said correction mode.

8. The improvement according to claim 7, wherein said fourth control input signal has voltage value substantially equal to said third predetermined value substantially during any clock cycle for which said network changes from said syndrome reversal phase of said correction mode to said error pattern computation phase of said correction mode.

9. The improvement according to claim 7, wherein said third control input signal, or the binary complement of said third control input signal, has a voltage value equal to the logical OR of said eighth data input signal for said processor unit no. $r=0$ with a seventh control input signal, where said seventh control input provides timing and functional activity status.

10. The improvement according to claim 9, wherein said second control input signal is substantially equal to the logical AND, or the binary complement of the logical and, of said sixth control input signal, said seventh control input signal, and a substantially periodic signal that is equal to a logical one only during one clock cycle out of q consecutive cycles.

11. A network for encoding a digital message word to produce an augmented message word to be transmitted, for decoding a received message word that is a potentially corrupted version of said augmented message word to detect digital signal errors in said received message word and to provide said digital signal error in an encoded form, and for attempting to identify the pattern of said digital signal error and the location of said pattern in said received message word, the network comprising:

an M-bit linear feedback shift register for encoding a digital message word, for decoding a received message word, for attempting to identify the pattern of the detected digital signal error by division by one of a plurality of predetermined error check divisor polynomials, and for allowing access to the contents of segments of said shift register on q parallel data lines;

a q-bit shifter/counter register connected to said shift register, to receive timing signals and a clock phase signal from a source external to the network, to receive a first stream of serial data from a source external to the network, and to operate as a counter in an error computation phase of a correction mode or a shifter in a syndrome reversal phase of a correction mode, in response to phase select signals, wherein when said shifter/counter register operates as a counter in said error pattern computation phase of said correction mode, said shifter/counter register receives an input initializing said shifter/counter register to a predetermined count, receives a count enable signal, transfers said shifter/counter's contents to q parallel data lines in response to an input signal, and produces an output signal indicating when said shifter/counter register has reached a predetermined limit count, and wherein when said shifter/counter register operates as a shifter in said syndrome reversal phase of said correction mode, the contents of q parallel data lines are transferred to said shifter/counter in response to an input signal and the contents of said shifter/counter are transferred to said shift register as a second stream of serial data in response to a shift enable signal;

a feedback enable/disable polynomial select module having a plurality of input terminals and output terminals and being connected to said shift register and to said shifter/counter register, to receive a third stream of serial data from a source external to the network, to receive a fourth stream of serial data from said shift register, to receive said second stream of serial data from said shifter/counter register, and to receive digital signals indicating whether the network is in an encode mode, a decode mode, or said error pattern computation phase of said correction mode, whether said shifter/counter register currently operates as shifter or as a counter, which one of said plurality of error check divisor polynomials should be activated in said shift register, and whether feedback should be enabled or disabled from said shift register to said feedback enable/disable polynomial select module, and to produce output signals that select which one of said plurality of error check divisor polynomials is to be used in said shift register, and to produce a fifth stream of serial data at an output terminal, resulting from processing said second, third and fourth streams of serial data, including means coupling said fifth serial stream to said shift register;

a control register connected to said shift register, to said shifter/counter register and to said feedback enable/disable polynomial select module, to receive input signals indicating whether the network is in said error pattern computation phase of said correction mode, whether an error has been identified that is correctable by the network, whether said shifter/counter register has just been cleared, whether said shifter/counter register has reached said predetermined limit count, and to receive a clock phase signal from a source external to the network, said control register including means responsive to said input signals to produce output signals indicating whether shift register feedback should be disabled, whether said shifter/counter register should currently operate as a counter or a shifter, and whether said shifter/counter register should be enabled to perform the selected operation, and which one of said plurality of error check polynomials should be activated within said shift register;

an error trap module connected to said shift register, to said control register and to said shifter/counter register, to receive clock phase and timing control input signals from a source external to the network, to receive input signals indicating the bit content of each of the M bits in said shift register, to receive input signals indicating which one of said plurality of error check divisor polynomials should be activated within said shift register and whether said shifter/counter register currently operates as a counter or as a shifter, said error trap module including means responsive to said input signals to produce output signals indicating whether an error has been detected in the received message word in said decode mode and whether a correctable error pattern has been identified by the network in said error pattern computation phase; and a timing/control module connected to said shift register, to said control register, to said feedback enable/disable polynomial select module, and to said shifter/counter register, to receive timing signals from a source external to the network and input signals indicating whether the network is currently in said encode mode, said decode mode, said syndrome reversal phase of said correction mode, or said error pattern computation phase of said correction mode and whether said shifter/counter register is currently operating as a counter or as a shifter and further to receive a timing signal that indicates when augmentation should begin in said encoding mode, said timing and control module including means responsive to said input signals to produce output signals indicating whether said shifter/counter register is to be initialized to a predetermined count and whether said shift register should be initialized, and whether said shift register should be enabled to shift in said encode mode, said decode mode and said correction mode.

* * * * *

UNITED STATES PATENT AND TRADEMARK OFFICE
CERTIFICATE OF CORRECTION

PATENT NO.   : 4,979,173
DATED        : December 18, 1990
INVENTOR(S)  : Geldman, et al.

It is certified that error appears in the above-identified patent and that said Letters Patent is hereby corrected as shown below:

Col. 1, line 59, delete "is" and insert --in--.

Col. 2, line 4, delete "single" and insert --signal--.

Col. 3, line 5, delete "amd" and insert --and--.

Col. 3, line 44, delete "v=" and insert --$\underline{v}$=--.

Col. 3, line 52, delete "u=" and insert --$\underline{u}$=--.

Col. 3, line 54, delete "30" and insert --+--.

Col. 3, line 54, delete "w=" and insert --$\underline{w}$=--.

Col. 4, line 24, delete "u=" and insert --$\underline{u}$=-- and after "(n-k)" insert -- - --.

Col. 4, line 25, delete "r=" and insert --$\underline{r}$=--.

Col. 4, line 27, delete "t" and insert --$\underline{t}$--.

Col. 4, line 33, delete "t" and insert --$\underline{t}$--.

Col. 4, line 34, delete "h" and insert --$\underline{h}$--.

Col. 4, line 46, delete "p=" and insert --P=-- (first occurrence).

Col. 4, line 56-57, the equation should read --$\underline{S}$ = ($s_{n-k-1}$, $s_{n-k-2}$, ... $s_1$, $s_0$).--.

Col. 5, line 1, delete "e" and insert --$\underline{e}$--.

UNITED STATES PATENT AND TRADEMARK OFFICE
CERTIFICATE OF CORRECTION

PATENT NO. : 4,979,173
DATED : December 18, 1990
INVENTOR(S) : Geldman, et al.

It is certified that error appears in the above-identified patent and that said Letters Patent is hereby corrected as shown below:

Col. 5, line 14, delete "(e)" and insert --($\underline{e}$)--.

Col. 5, line 17, the equation should read:
--$S_{j_0}(x) = e'_{s-1} x^{s-1} + \ldots + e'_1 x + e'_0 (e'_0 \neq 0, s<n-k)$--.

Col. 5, line 22, delete "h" and insert --$\underline{h}$--.

Col. 5, line 47, delete "w" and insert --$\underline{w}$--.

Col. 5, line 53, equation should read:
--$P(x) = x^{52}+x^{50}+x^{43}+x^{41}+x^{34}+x^{30}+x^{26}+x^{24}+x^8+1$--.

Col. 6, line 47, delete "wher" and insert --where--.

Col. 6, line 49, delete "A(ox" and insert --A(Ox--.

Col. 6, line 53, delete "u" and insert --$\underline{u}$-- and delete "r" and insert --$\underline{r}$--.

Col. 6, line 64, delete "(X)" and insert --(x)--.

Col. 6, line 66, delete "h" and insert --$\underline{h}$--.

Col. 6, line 67, delete "t" and insert --$\underline{t}$--.

Col. 7, line 16, delete "in" and insert --is--.

Col. 7, line 46, delete "were" and insert --where--.

Col. 7, line 52, equation should read:
--$0 \cdot 0 = 0 \cdot 1 = 1 \cdot 0 = 0,$--.

Col. 8, line 42, delete "and" and insert --$\underline{and}$--.

UNITED STATES PATENT AND TRADEMARK OFFICE
CERTIFICATE OF CORRECTION

PATENT NO.  : 4,979,173
DATED       : December 18, 1990
INVENTOR(S) : Geldman et al.

Page 3 of 4

It is certified that error appears in the above-identified patent and that said Letters Patent is hereby corrected as shown below:

Col. 8, line 51, delete "Pr(x)" and insert --$P_r(x)$--.

Col. 8, line 63, delete "06hd29" and insert --$O_{29}$--.

Col. 9, line 44, delete "s" and insert --$\underline{s}$--.

Col. 9, line 47, delete "ecc error" and insert --ecc·error--.

Col. 9, line 66, delete "s" and insert --$\underline{s}$--.

Col. 13, line 41, 42, 43 should read:
--Output $O_{D2SL}^{(r)}$
    $= q_{DF2R}^{(r)}$ if shift* = 1
    $= q_{DF2R}^{(r-1)}$ if shift = 1--

Col. 15, lines 30-33 should read:
--$O_{D2SL} = q_{DF2R}^{(r-1)}$ if shift = 1
         $= q_{DF2R}^{(r)}$ if shift* = 1.--

Col. 15, line 50 should read:
--ecc·corr(t′)* = we·corr(t′-1)*.--

Col. 15, line 60, after "similarly," insert --the--.

Col. 16, line 3, delete "or" and insert --$\underline{or}$--.

Col. 16, line 25, delete "ser" and insert --serial--.

Col. 16, line 44, after "O51" insert --*--

UNITED STATES PATENT AND TRADEMARK OFFICE
CERTIFICATE OF CORRECTION

PATENT NO.  : 4,979,173
DATED       : December 18, 1990
INVENTOR(S) : Geldman et al.

It is certified that error appears in the above-identified patent and that said Letters Patent is hereby corrected as shown below:

Col. 16, line 62, delete "53" and insert --O53--.

Col. 17, line 60, equation should read:

$$-- O83 = (\prod_{j=21}^{42} (q_j^*))^* , --$$

Col. 18, line 1, delete "O α 55)" and insert --O - 55)--.

Signed and Sealed this

Sixth Day of July, 1993

MICHAEL K. KIRK

*Attest:*

*Attesting Officer*     *Acting Commissioner of Patents and Trademarks*